(12) United States Patent
Schepens et al.

(10) Patent No.: US 11,139,134 B2
(45) Date of Patent: Oct. 5, 2021

(54) HIGH ISOLATION SERIES SWITCH

(71) Applicant: Qorvo US, Inc., Greensboro, NC (US)

(72) Inventors: Cornelius Petrus Elisabeth Schepens, Beuningen (NL); Roberto Gaddi, Rosmalen (NL)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/856,156

(22) Filed: Apr. 23, 2020

(65) Prior Publication Data
US 2020/0343067 A1  Oct. 29, 2020

Related U.S. Application Data

(60) Provisional application No. 62/837,635, filed on Apr. 23, 2019.

(51) Int. Cl.
| H01H 59/00 | (2006.01) |
| H01H 9/54 | (2006.01) |
| H03K 17/687 | (2006.01) |
| B81B 7/00 | (2006.01) |
| H01H 1/00 | (2006.01) |

(52) U.S. Cl.
CPC .......... H01H 59/0009 (2013.01); B81B 7/008 (2013.01); H01H 1/0036 (2013.01); H01H 9/548 (2013.01); H03K 17/6871 (2013.01)

(58) Field of Classification Search
CPC .................. H01H 59/0009; H01H 1/0036
See application file for complete search history.

(56) References Cited

U.S. PATENT DOCUMENTS

| 7,999,335 | B2 * | 8/2011 | Mikami | ............. B81C 1/00166 |
| | | | | 257/415 |
| 8,470,629 | B2 * | 6/2013 | Mikami | ............. H01H 59/0009 |
| | | | | 438/50 |
| 9,487,395 | B2 * | 11/2016 | Troy | .................. B81C 1/00611 |
| 2016/0240320 | A1 * | 8/2016 | Renault | .................. H01G 5/011 |
| 2019/0066937 | A1 * | 2/2019 | Gudeman | ............ H01H 1/0036 |

* cited by examiner

Primary Examiner — Alexander Talpalatski
(74) Attorney, Agent, or Firm — Withrow & Terranova, PLLC

(57) ABSTRACT

Unwanted or parasitic capacitances may occur in MEMS switches. To reduce or eliminate the impact of the unwanted or parasitic capacitance, an extra device, such as a second MEMS switch, may be coupled to a first MEMS switch to divert the unwanted or parasitic capacitance to ground.

20 Claims, 20 Drawing Sheets

HIGH ISOLATION SERIES SWITCH

RELATED APPLICATIONS

This application claims the benefit of U.S. provisional patent application Ser. No. 62/837,635, filed on Apr. 23, 2019, the disclosure of which is incorporated herein by reference in its entirety.

FIELD OF THE DISCLOSURE

Embodiments of the present disclosure generally relate to high efficiency switches for electrical apparatus. More specifically, aspects of the disclosure relate to high isolation series switches.

BACKGROUND

High efficiency switches are needed for many types of apparatus. As a non-limiting example, high efficiency switches are needed in the cellular telephone market to allow needed operation that provides not only an electrically efficient manner of operations but also provides proper isolation of signal and acceptable insertion loss capabilities.

As electronics are becoming more prevalent and greater needs are placed upon these electronics, the overall scale of the electronics is decreasing, while the required workload on the electronics is increasing. Switches, such as microelectromechanical system (MEMS) devices, are called upon to handle varying power loads from different types of electrical component manufacturers. Component manufacturers, therefore, are challenged in that the components manufactured may be asked to withstand widely differing power loads.

As time moves forward, the manufacturers are also called upon to increase the overall capabilities for performance. In one such type of market, telecommunications component manufacturers are being called upon to create cellular phones that range from 600 MHz to 6000 MHz capacity. This expanded capacity, compared to previous generations of cellular phones requires functionality that was previously unavailable to the consumer. Consumer demand, however, dictates that the overall footprint of devices incorporating this technology maintain a specific form and size factor. Additionally, there is a need to provide such added functionality with minimal cost increase.

Due to the design of various switches, two metals are often in proximity, and thus unwanted or parasitic capacitance between the two nodes of the switch can develop during normal device operation in the OFF state. The unwanted or parasitic capacitance negatively impacts device performance and leads to unpredictable device performance.

Therefore, there is a need in the art for devices that can reduce or eliminate unwanted or parasitic capacitance.

SUMMARY

Unwanted or parasitic capacitances may occur in microelectromechanical system (MEMS) switches. To reduce or eliminate the impact of the unwanted or parasitic capacitance, an extra device, such as a second MEMS switch, may be coupled to a first MEMS switch to divert the unwanted or parasitic capacitance to ground.

In one embodiment, a MEMS device comprises: a first MEMS switch and a second MEMS switch. The first MEMS switch comprises at least one contact electrode; at least one pull-in electrode; and a movable beam. The second MEMS switch comprises: at least one contact electrode, wherein the at least one contact electrode is coupled to the at least one pull-in electrode, and a movable beam.

In another embodiment, the MEMS device comprises a first MEMS switch, the first MEMS switch comprising at least one contact electrode, at least one pull-in electrode, and a movable beam; and either:
  a second MEMS switch, the second MEMS switch comprising at least one contact electrode, wherein the at least one contact electrode is coupled to the at least one pull-in electrode or the movable beam; or
  both the at least one pull-in electrode and the movable beam and the at least one pull-in electrode and the movable beam; or
  at least one transistor acting as an isolation switch and coupled to the at least one pull-in electrode or the movable beam or coupled to both the at least one pull-in electrode and the movable beam.

In another embodiment, the movable beam is coupled to an electric node, and the electric node may be an RF node. The movable beam may be coupled to ground. The at least one pull-in electrode is coupled to the electrical node, and a resistor may be coupled between the at least one pull-in electrode and the electrical node. The at least one contact electrode may be coupled to the RF node. The at least one pull-in electrode may be coupled to the electrical node.

In another embodiment, the at least one contact electrode includes a first contact electrode and a second contact electrode. The at least one pull-in electrode is disposed between the first contact electrode and the second contact electrode. The movable beam is coupled to a resistor. The movable beam may be coupled to ground. The at least one contact electrode includes the first contact electrode and the second contact electrode. The first contact electrode is coupled to the at least one pull-in electrode, and the second contact electrode is coupled to the movable beam, or vice versa.

In another embodiment, a method of operating the above-described MEMS device comprises applying a voltage to the at least one pull-in electrode. The movable beam is grounded. The contact electrode is grounded, and the movable beam is coupled to the at least one pull-in electrode. The contact electrode may be coupled to the movable beam.

In another embodiment, a MEMS device comprises a plurality of MEMS switches that each includes a beam, one or more contact electrodes, and one or more pull-in electrodes, wherein the beam is movable between a position spaced from the one or more contact electrodes and a position in contact with the one or more contact electrodes; and either:
  at least one isolation switch, wherein the at least one isolation switch is coupled to,
  at least one pull-in electrode, or
  the beam, or
  both the at least one pull-in electrode and the beam.

In another embodiment, each isolation switch includes a beam, one or more contact electrodes; and one or more pull-in electrodes, wherein the beam is movable between a position spaced from the one or more contact electrodes and a position in contact with the one or more contact electrodes; or at least one transistor acting as an isolation switch and coupled to at least one pull-in electrode, or the beam, or both the at least one pull-in electrode and the beam.

In another embodiment, a contact electrode of the one or more contact electrodes is coupled to the beam. The contact electrode of the one or more contact electrodes may be coupled to the one or more pull-in electrodes.

In another embodiment, a double pole double throw switch comprises a plurality of switches with each switch coupled to two nodes, wherein a control signal coupled to pull-in electrodes of main switches is oppositely controlled to a control signal coupled to the pull-in electrodes of main switches and wherein each switch is coupled to either:

a corresponding isolation switch, and wherein each isolation switch is coupled to ground, wherein contact electrodes of any successive isolation switch couple to a beam and a pull-in electrode of a corresponding main switch, wherein a control signal coupled to the pull-in electrode of any successive isolation switch is oppositely controlled versus a control signal coupled to the pull-in electrode of a corresponding main switch; or at least one corresponding transistor acting as an isolation switch and coupled to the beam and the pull-in electrode of the corresponding main switch.

In another embodiment, each switch has at least two contact electrodes, and wherein each contact electrode of a corresponding switch is coupled to a different node. Each isolation switch has at least one contact electrode that is coupled to a corresponding beam of a switch. Each isolation switch has another contact electrode that is coupled to a pull-in electrode of a corresponding switch.

In another embodiment, a single pole multi throw switch comprises a plurality of main switches and either:

an isolation switch coupled to each main switch, wherein each isolation switch has a beam that is connected to ground, wherein contact electrodes of any successive isolation switch couple to the beam and a pull-in electrode of a corresponding main switch, wherein a control signal coupled to the pull-in electrode of any successive isolation switch is oppositely controlled versus a control signal coupled to the pull-in electrode of the corresponding main switch; or at least one corresponding transistor acting as an isolation switch and coupled to the beam and the pull-in electrode of the corresponding main switch.

In another embodiment, each isolation switch includes an extra contact electrode, wherein extra contact electrodes are coupled to nodes through a resistor.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
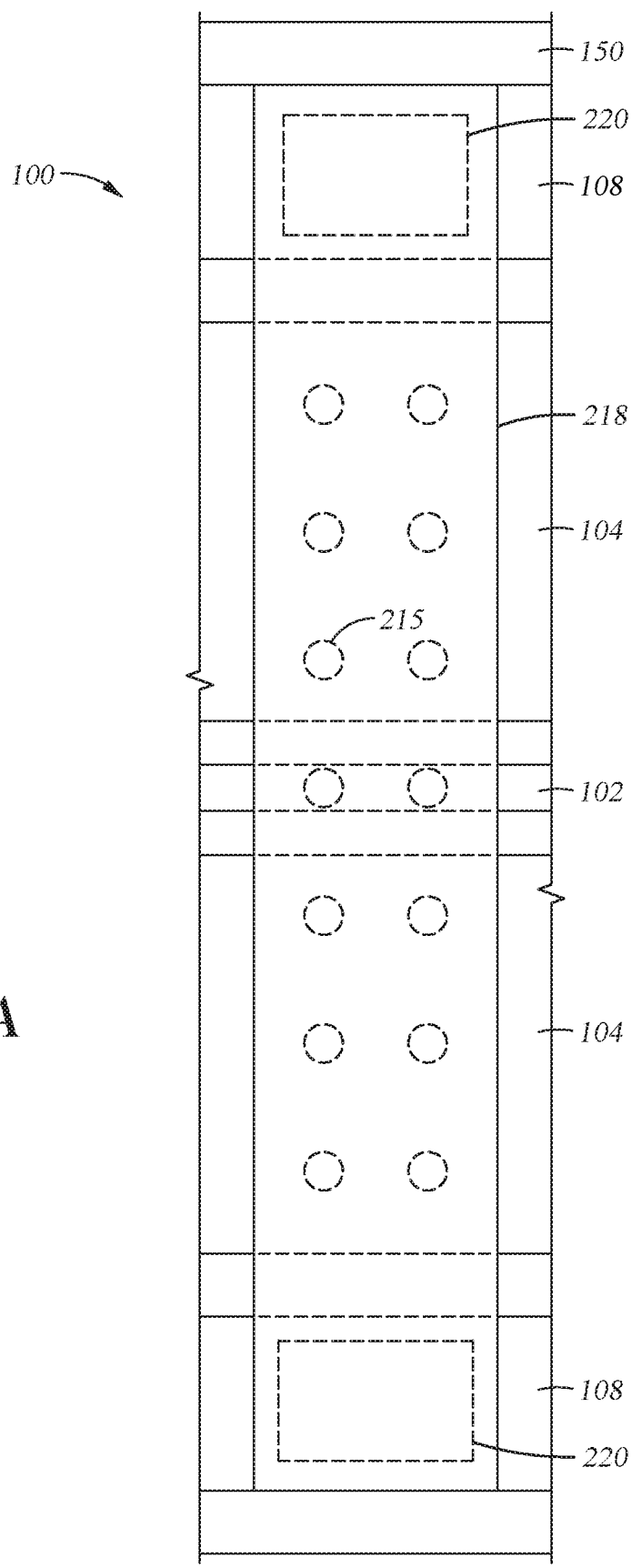
FIG. 1A is a schematic top-view of a microelectromechanical system (MEMS) ohmic switch.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Unwanted or parasitic capacitances occur in MEMS switches. To reduce or eliminate the impact of the unwanted or parasitic capacitance, an extra device, such as a second MEMS switch, may be coupled to a first MEMS switch to divert the unwanted or parasitic capacitance to ground.

FIG. 1A is a schematic top-view of a MEMS ohmic switch 100. The ohmic switch 100 comprises an RF electrode 102, pull-down electrodes 104 and anchor electrodes 108. In operation, when a sufficiently high voltage is applied to the pull-down electrodes 104, the MEMS ohmic switch 100 is actuated down towards the RF electrode 102 and forms an ohmic connection between the RF electrode 102 and anchor electrodes 108.

Figure 1B:
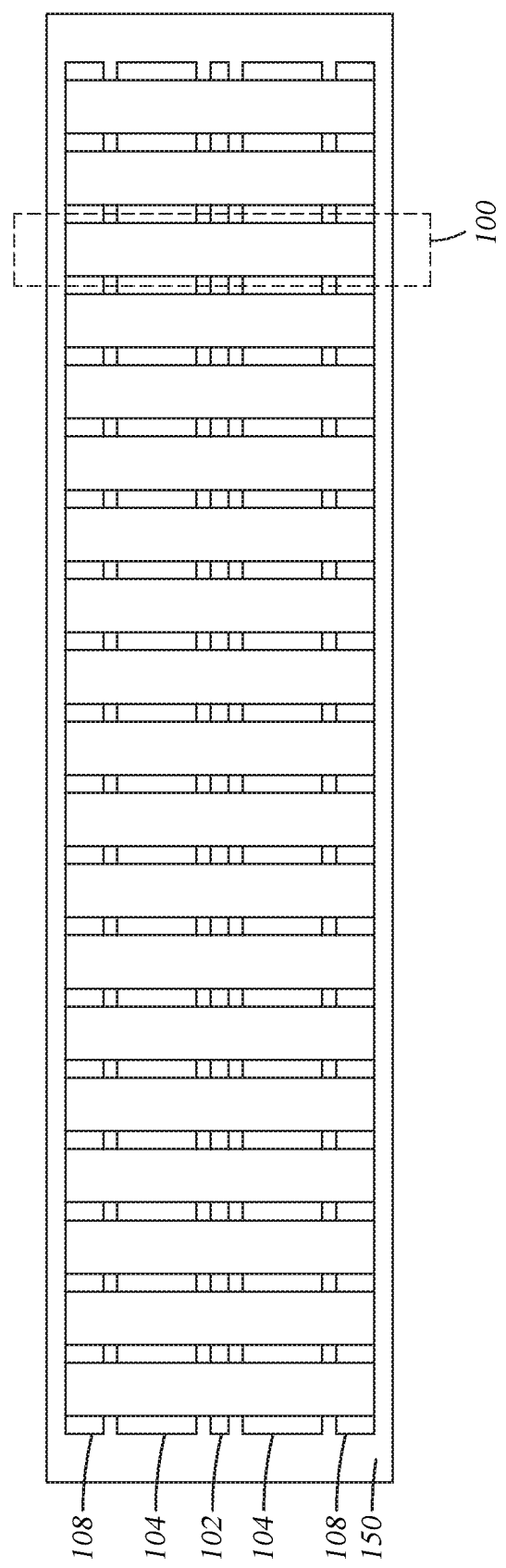
FIG. 1B is a schematic top view of an MEMS ohmic switch cell containing a number of parallel operated MEMS ohmic switches.

FIG. 1B is a schematic top view of an ohmic switch cell 150 containing a number of MEMS ohmic switches 100. All MEMS switches 100 in the ohmic switch cell 150 are turned on at the same time by applying a sufficiently high voltage to the pull-down electrodes 104. Because many MEMS ohmic switches 100 are operated in parallel, the resistance between the RF electrode 102 and anchor electrodes 108 is reduced.

Figure 1C:
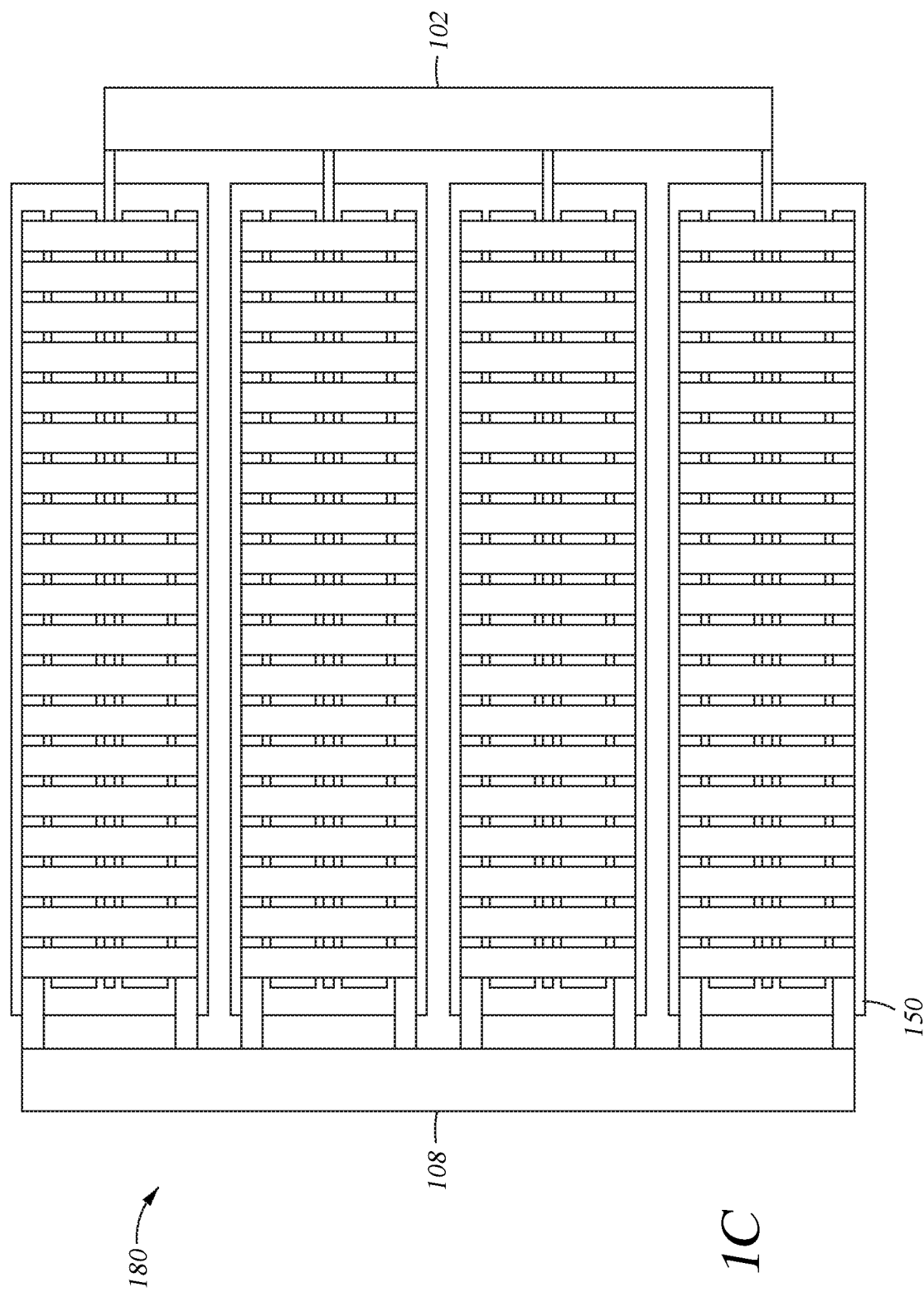
FIG. 1C is a schematic top view of a MEMS ohmic switch cell array containing a number of parallel operated MEMS ohmic switch cells.

FIG. 1C shows a schematic top-view of a MEMS ohmic switch cell array 180. The MEMS ohmic switch array 180 contains a number of parallel operated MEMS ohmic switch cells 150. The RF electrodes 102 of each ohmic switch cell 150 are connected together at one end of each ohmic switch cell 150, while the anchor electrodes 108 are connected together at the other end of each ohmic switch cell 150. When all ohmic switch cells 150 are turned on, a further reduction of the resistance between the RF electrode 102 and anchor electrode 108 occurs when compared to a single ohmic switch cell 150. At the same time, because many MEMS ohmic switches 100 are operated in parallel, the MEMS ohmic switch cell array 180 can handle more current compared to a single MEMS ohmic cell 150.

Figure 2A:
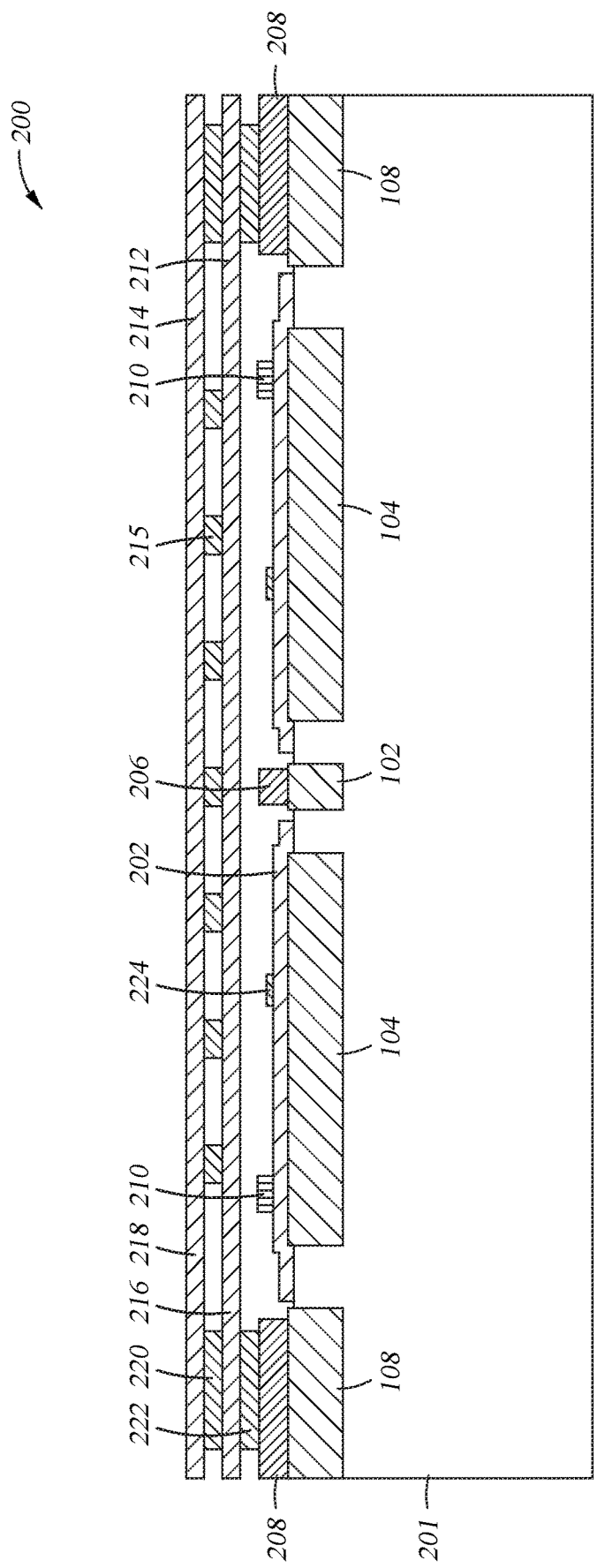
FIG. 2A is a schematic cross-sectional view of a MEMS ohmic switch.

FIG. 2A shows a cross-section view of a MEMS ohmic switch 200. The MEMS ohmic switch 200 comprises an RF electrode 102, pull-down electrodes 104 and anchor electrodes 108 located on a substrate 201. The pull-down electrodes 104 are covered with a dielectric layer 202 to avoid a short-circuit between the MEMS ohmic switch movable beam and the pull-down electrode 104 in the pulled-down state. Suitable materials for the dielectric layer 202 include silicon based materials including silicon-oxide, silicon-dioxide, silicon-nitride and silicon-oxynitride. The thickness of the dielectric layer 202 is typically in the range of 50 nm to 150 nm to limit the electric field in the dielectric layer 202. On top of the RF electrode 102 is the RF contact 206 to which the movable beam forms an ohmic contact in the pulled-down state. On top of the anchor electrodes 108 are the anchor contacts 208 to which the movable beam (oftentimes referred to as the MEMS device) is anchored. Suitable materials used for the RF contact 206 and anchor contacts 208 include Ti, TiN, TiAl, TiAlN, AlN, Al, W, Pt, Ir, Rh, Ru, $RuO_2$, ITO and Mo and combinations thereof.

Additional stoppers 210 are located between the anchor contacts 208 and the RF contact 206. More stoppers 224 are located between the stoppers 210 and RF contact 206. Suitable materials that may be used for the stoppers 210, 224 include Ti, TiN, TiAl, TiAlN, AlN, Al, W, Pt, Ir, Rh, Ru, $RuO_2$, ITO, Mo and silicon based materials such as silicon-oxide, silicon-dioxide, silicon-nitride and silicon-oxynitride and combinations thereof.

The movable beam or switching element or MEMS bridge contains a stiff bridge consisting of conductive layers 212, 214 which are joined together using an array of vias 215. The conductive layers 212, 214 and array of vias 215 allow for a stiff plate-section and compliant legs to provide a high contact force while keeping the operating voltage to acceptable levels. The MEMS bridge is suspended by legs 216 formed in the lower conductive layer 212 and legs 218 formed in the upper conductive layer 214 of the MEMS bridge. The upper conductive layer 214 of the MEMS bridge is anchored to the lower layer 212 of the MEMS bridge in the anchor with via 220. The lower conductive layer 212 of the MEMS bridge is anchored to the anchor contact 208 with via 222. Because these legs 216, 218 are not joined together with the array of vias 215 like in the MEMS bridge, the compliance of these legs 216, 218 is still low enough to allow for reasonable operating voltages (e.g. 25V to 40V) to pull the MEMS bridge in contact with the RF contact 206 and stoppers 210, 224, which allows for a cheap integration of the complementary metal oxide semiconductor controller with a charge-pump to generate the voltages to drive the MEMS device.

Current that is injected from the RF contact 206 into the MEMS bridge when the MEMS ohmic switch is actuated down flows out through the MEMS bridge and legs 216, 218 in both directions to the anchor electrodes 108 located on either side of the switch-body.

Figure 2B:
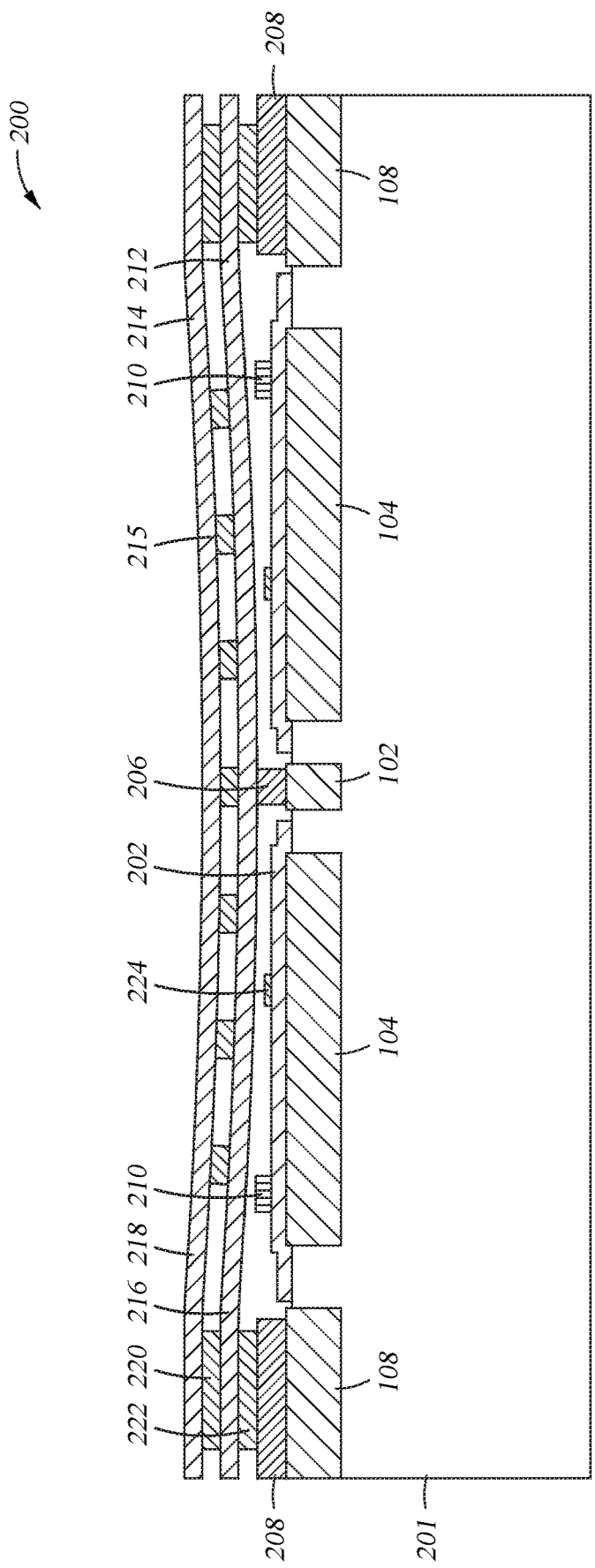
FIG. 2B is a schematic cross-sectional view of the MEMS ohmic switch of FIG. 2A which is being actuated down and hits the contact-electrode.

FIG. 2B shows the MEMS ohmic switch 200 as it is being actuated downwards during the dynamic snap-in. Because of the unstable nature of the snap-in behavior, the MEMS bridge comes into contact with the RF contact 206 with a high impact, which can create contact wear.

Figure 2C:
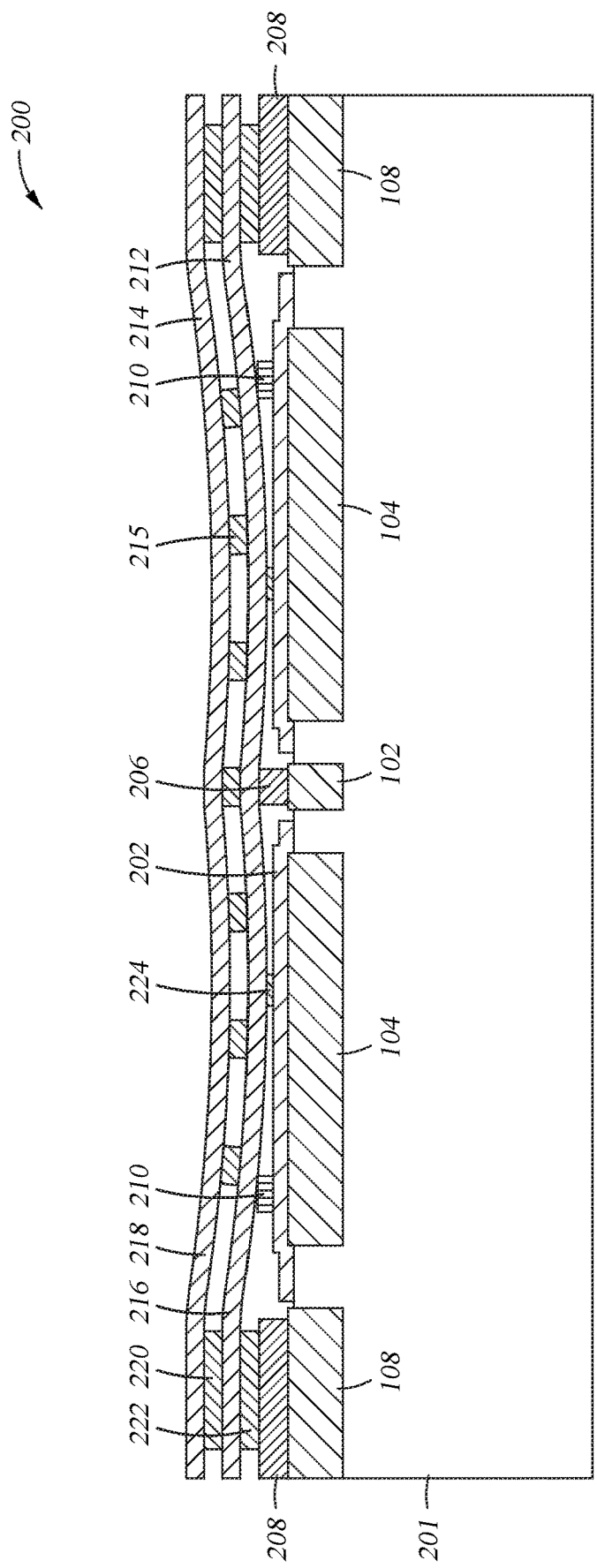
FIG. 2C is a schematic cross-sectional view of the MEMS ohmic switch of FIG. 2B which is actuated down in the final state on the contact electrode and additional stoppers.

FIG. 2C shows the MEMS ohmic switch 200 as in the final actuated downwards state. The MEMS bridge is in contact with the RF contact 206 and additional stoppers 210, 224. If the height of the stoppers 210 is sufficiently high, the MEMS device may not touch stopper 224. The stoppers 224 then act as fail-safe stoppers to prevent the MEMS bridge from landing on the dielectric layer 202 above the pull-down electrode 104, which could lead to charging of the dielectric layer 202 and a failure to operate the device.

When the voltage on the pull-down electrodes 104 is reduced, the stoppers 210, 224 are the first to disengage from the MEMS bridge, and the device will then be in the state shown in FIG. 2B. The RF contact 206 is the last to disengage from the MEMS bridge before the device returns to the freestanding state shown in FIG. 2A. The pull-off force from the RF contacts 206 is set by the stiffness of the legs 216, 218. Since the legs 216, 218 are designed for limited operating voltages of 25V to 40V, the restoring force of the legs 216, 218 is limited and the MEMS device could remain stuck down on the RF contacts 206, leading to a device failure.

Figure 3A:
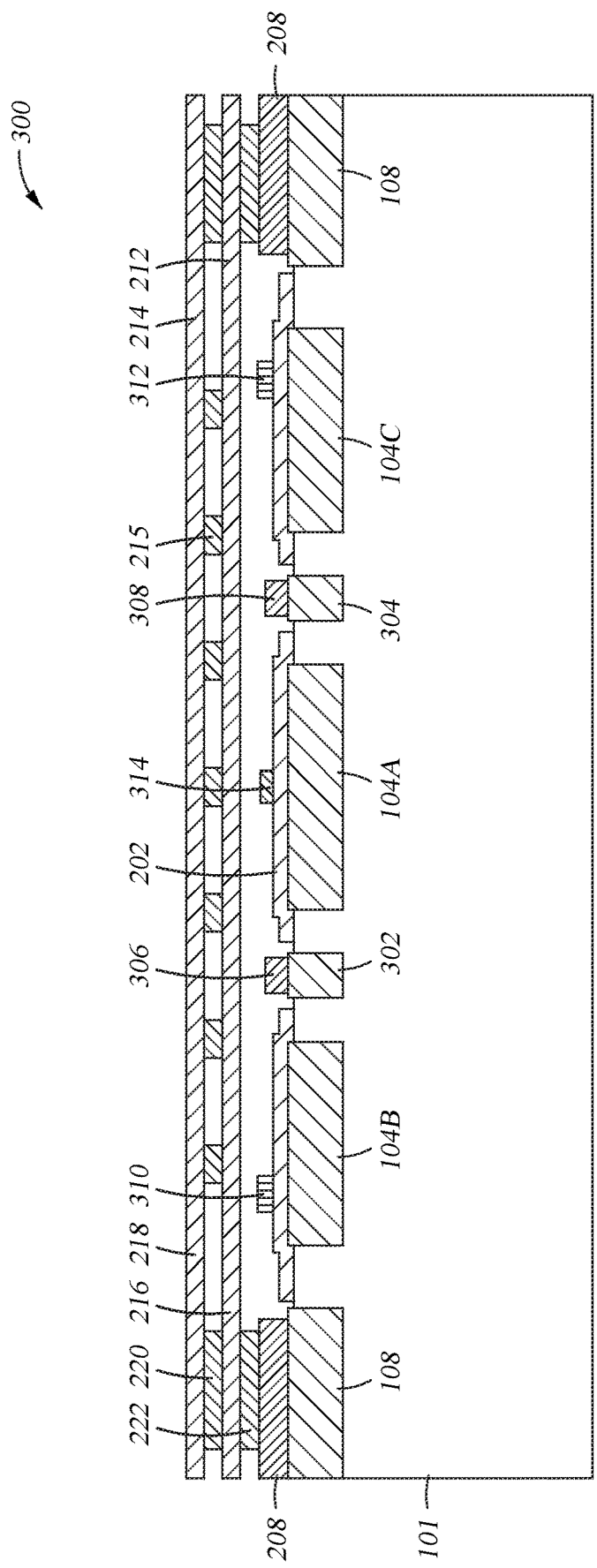
FIG. 3A is a schematic cross-sectional view of a MEMS ohmic switch according to one embodiment.

FIG. 3A shows a cross-section view of a MEMS ohmic switch 300 according to one embodiment. The switch operates with near-zero impact force on the RF contact and has a high restoring force to break the contact when releasing the movable beam while still operating the switch 300 at limited operating voltages of 25V to 40V.

The switch 300 contains RF electrodes 302, 304, pull-down electrodes 104A-104C and anchor electrodes 108 located on a substrate 101. The RF electrodes 302, 304 are each disposed between two of the pull-down electrodes 104A, 1048, and 104C. Specifically, RF electrode 302 is disposed between a center pull-down electrode 104A and an edge pull-down electrode 104B. Similarly, RF electrode 304 is disposed between the center pull-down electrode 104A and another edge pull-down electrode 104C. The pull-down electrodes 104A-104C are covered with a dielectric layer 202 to avoid a short-circuit between the MEMS switch and the pull-down electrodes 104A-104C in the pulled-down state. Suitable materials for the dielectric layer 202 include silicon based materials including silicon-oxide, silicon-dioxide, silicon-nitride and silicon-oxynitride. The thickness of the dielectric layer 202 is within the range of 50 nm to 150 nm to limit the electric field in the dielectric layer 202. On top of RF electrode 302 is RF contact 306, and on top of RF electrode 304 is RF contact 308. In the final pulled-down state shown in FIG. 3D, the switch body forms an ohmic contact to both RF contacts 306, 308. On top of the anchor electrode 108 is the anchor contact 208 to which the MEMS device is anchored. Suitable materials used for the RF contacts 306, 308 and anchor contacts 208 include Ti, TiN, TiAl, TiAlN, AlN, Al, W, Pt, Ir, Rh, Ru, $RuO_2$, ITO and Mo and combinations thereof.

A center stopper 314 is located near the center of the switch between RF contacts 306, 308 and under the substantial center of the MEMS bridge. The center stopper 314 extends above the substrate 101 by a greater distance than that of the RF contacts 306, 308 so that upon actuation, the MEMS bridge comes into contact with center stopper 314 first. In one embodiment, the center stopper 314 extends above the substrate 101 by a distance that is equal to that of the RF contacts 306, 308. Additional stoppers 310, 312 are disposed between the RF contacts 306, 308 and the anchor contact 208. Specifically, stopper 310 is disposed between an anchor contact 208 and RF contact 306. Stopper 312 is disposed between an anchor contact 208 and RF contact 308. The stoppers 310, 312 extend above the substrate 101 by a greater distance than do the RF contacts 306, 308 so that upon actuation the MEMS bridge comes into contact with the stoppers 310, 312 before coming into contact with the RF contacts 306, 308. The stoppers 310, 312 also extend above the substrate 101 by a distance greater than that of the center stopper 314 due to the bending of the MEMS bridge as the MEMS bridge is being actuated downwards. Suitable materials that may be used for the stoppers 310, 312 and center stopper 314 include silicon based materials including silicon-oxide, silicon-dioxide, silicon-nitride and silicon-oxynitride and combinations thereof.

The switch element contains a stiff bridge consisting of conductive layers 212, 214 which are joined together using an array of vias 215. The conductive layers 212, 214 and the array of vias 215 allow for a stiff plate-section and compliant legs to provide a high contact force while keeping the operating voltage to acceptable levels. The MEMS bridge is suspended by legs 216 formed in the lower conductive layer 212 and legs 218 formed in the upper conductive layer 214 of the MEMS bridge. The upper conductive layer 214 of the MEMS bridge is anchored to the lower conductive layer 212 in the anchor with via 220. The lower conductive layer 212 of the MEMS bridge is anchored to the anchor contact 208 with via 222. Because the legs 216, 218 are not joined together with the array of vias 215 like in the MEMS-bridge, the compliance of these legs is still low enough to allow for reasonable operating voltages to pull the MEMS bridge in contact with the RF contacts 306, 308 and stoppers 310, 312 and center stopper 314.

Current that is injected from the RF contact 306 into the MEMS bridge when the MEMS switch is actuated down flows out through the MEMS bridge and RF contact 308. The thicknesses of RF contacts 306, 308 and stoppers 310, 312 and center stopper 314 are set such that center stopper 314 is engaged first upon pulldown actuation, followed by stoppers 310, 312 and finally RF contacts 306, 308.

Figure 3B:
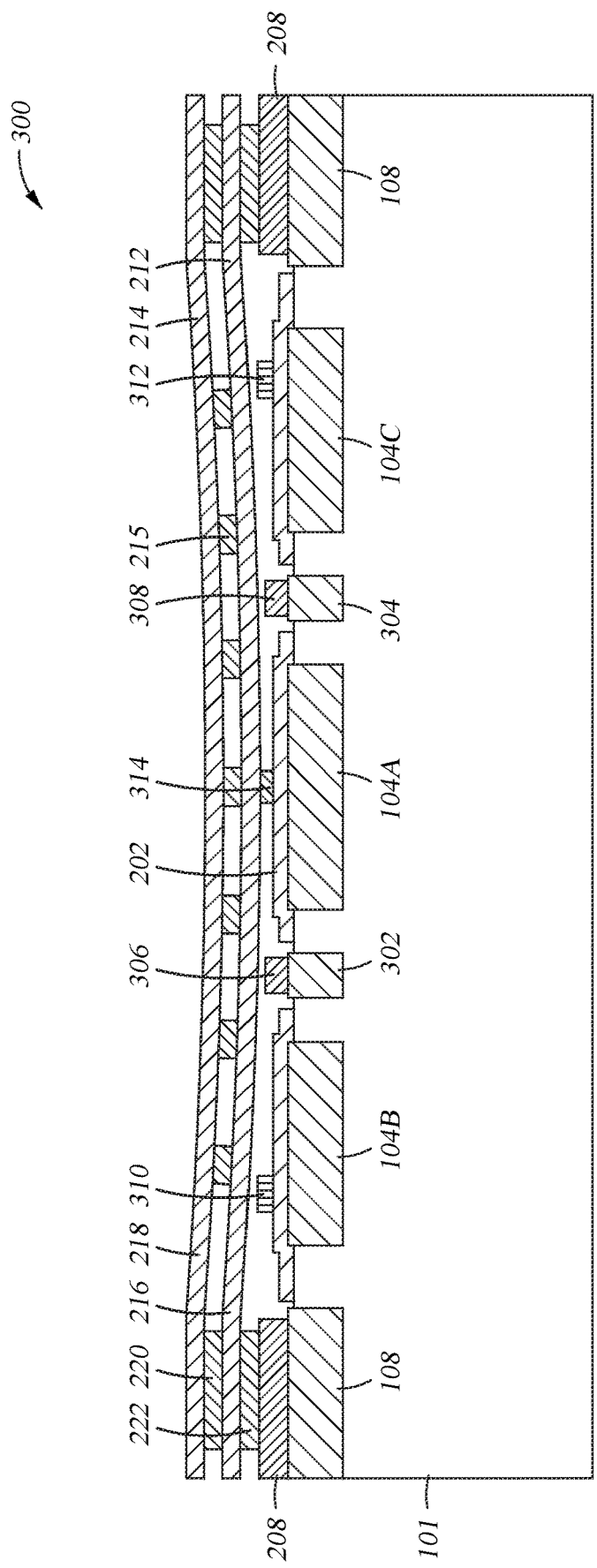
FIG. 3B is a schematic cross-sectional view of the MEMS ohmic switch of FIG. 3A which is actuated down on the center stopper.

FIG. 3B shows the MEMS ohmic switch 300 being actuated downwards during the dynamic snap-in. Because of the unstable nature of the snap-in behavior, the MEMS bridge comes in contact with the center stopper 314 with a high impact. The center stopper 314 comprises a dielectric material and thus the dielectric interface can sustain repeated impacts without damage. Note that in the position shown in FIG. 3B, the MEMS bridge is still spaced from stoppers 310, 312 and RF contacts 306, 308. For the MEMS ohmic switch 300 to be moved from the position shown in FIG. 3A to the position shown in FIG. 3B, a voltage is applied to the one or more of the pull-in electrodes 104A-104C and the MEMS bridge is moved a first distance such that the MEMS bridge contacts stopper 314 but remains spaced from stoppers 310, 312 and RF contacts 306, 308.

Figure 3C:
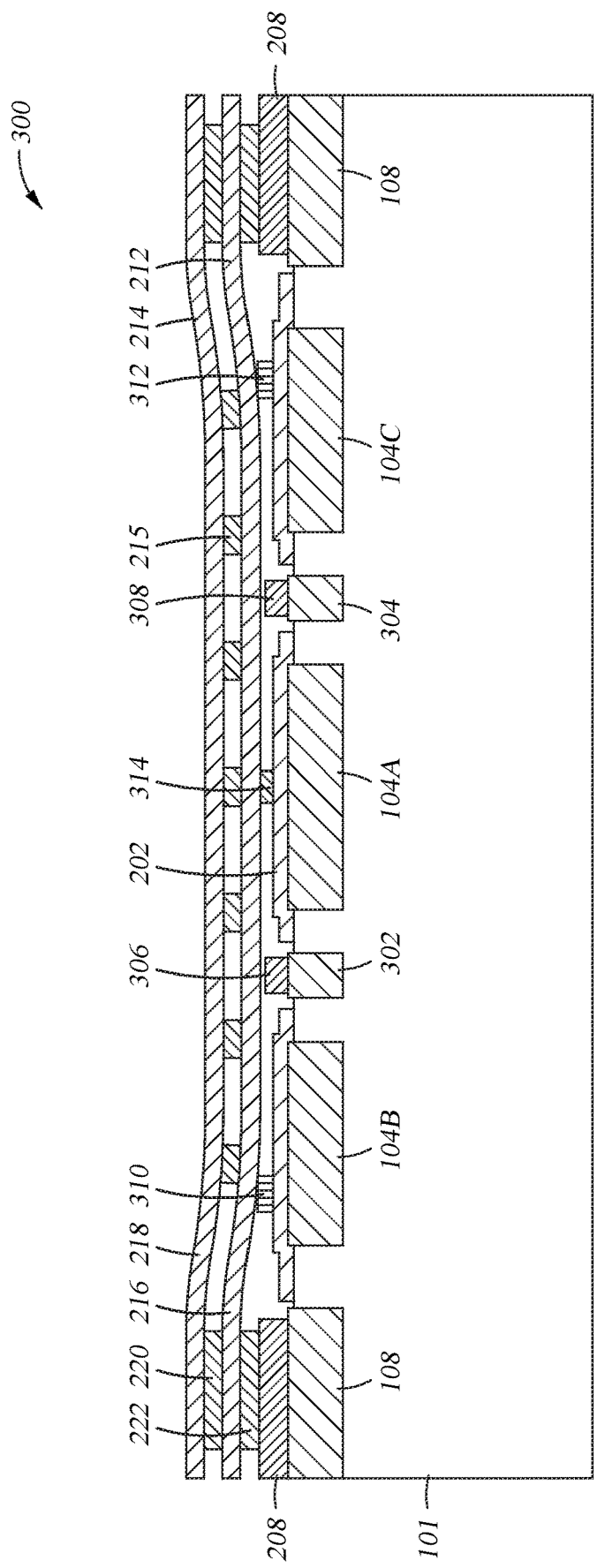
FIG. 3C is a schematic cross-sectional view of the MEMS ohmic switch of FIG. 3B which is actuated down on the center stopper and the back stoppers.

FIG. 3C shows the MEMS ohmic switch 300 a moment in time later after landing on the stoppers 310, 312. At this point, the stiff MEMS bridge is not in contact with the RF contacts 306, 308, because a larger electrostatic force is required to bend the stiff MEMS bridge any further. As the voltage on the pull-down electrodes 104A-104C is ramped up to the final operating value, the MEMS bridge slowly flexes between stoppers 310, 312 and center stopper 314 until finally hitting the RF contacts 306, 308. For the MEMS ohmic switch 300 to be moved from the position shown in FIG. 3B to the position shown in FIG. 3C, additional voltage (or simply continuation of the voltage applied to move the MEMS bridge to the position shown in FIG. 3B) is applied to the one or more of the pull-in electrodes 104A-104C, and the MEMS bridge is moved a second distance such that the MEMS bridge contacts stoppers 310, 312 and center stopper 314 but remains spaced from the RF contacts 306, 308.

Figure 3D:
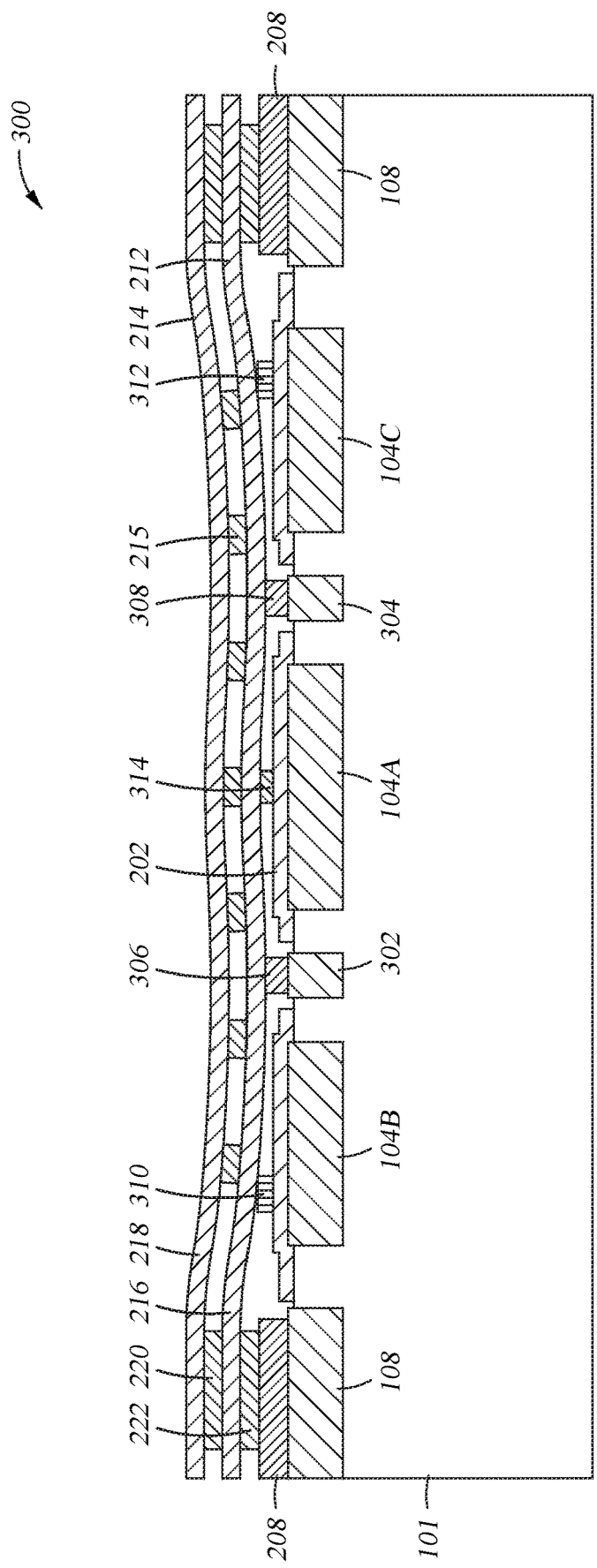
FIG. 3D is a schematic cross-sectional view of the MEMS ohmic switch of FIG. 3C which is actuated down in the final state on the contact electrode, center stopper and back stoppers.

FIG. 3D shows the MEMS ohmic device in the final state after the voltage on the pull-down electrodes 104A-104C has ramped up to the final operating value. If the height above the substrate 101 of the RF contacts 306, 308 is set too low, the MEMS bridge shows a secondary snap-in behavior from the initial touchdown on stoppers 310, 312 and center stopper 314 to the final state when the MEMS bridge also lands on RF contacts 306, 308. The impact of the final landing on the RF contacts 306, 308 is greatly reduced from the initial impact on the center stopper 314 because the travel distance from the device state in FIG. 3C to the device state in FIG. 3D is very limited. If the RF contacts 306, 308 are set high enough, the touchdown of the MEMS bridge on the RF contacts can be gentle and not show a secondary snap-in behavior. The impact in such a case is set by the ramp rate of the voltage on the pull-down electrodes 104A-104C. In this way, the impact of the MEMS bridge on the RF contacts 306, 308 can be limited, which improves the wear of the contact surfaces. For the MEMS ohmic switch 300 to be moved from the position shown in FIG. 3C to the position shown in FIG. 3D, additional voltage (or simply continuation of the voltage applied to move the MEMS bridge to the position shown in FIG. 3C) is applied to the one or more of the pull-in electrodes 104A-104C, and the MEMS bridge is moved a second distance such that the MEMS bridge contacts stoppers 310, 312 and center stopper 314 and RF contacts 306, 308.

When the voltage on the pull-down electrode 104A-104C is ramped down upon release of the MEMS bridge, the RF contacts 306, 308 are the first to disengage from the MEMS bridge, because the MEMS bridge, which is naturally stiff, is flexed between stoppers 310, 312 and center stopper 314 and has a high restoring force. The high restoring force provides for a robust way to break the ohmic contact. As the voltage on the pull-down electrodes 104A-104C continues to ramp down, subsequently the stoppers 310, 312 and center stopper 314 are disengaged from the MEMS bridge, returning the device to the freestanding state of FIG. 3A.

During operation, the heights above the substrate 101 for the RF contact 306, center stopper 314 and additional stoppers 310, 312 are set such that upon increasing a voltage on pull-down electrodes 104A-104C, the MEMS bridge first comes into contact with the center stopper 314, then the additional stoppers 310, 312, and then the RF contacts 306, 308, and wherein upon decreasing the voltage to the pull-down electrodes 104A-104C, the MEMS bridge first disengages the RF contacts 306, 308 and then the additional stoppers 310, 312. Furthermore, a height above the substrate 101 for the RF contacts 306, 308 is set such that upon increasing voltage applied to the pull-down electrodes 104A-104C, the MEMS bridge lands on the RF contacts 306, 308 without showing a snap-in behavior.

Figure 4A:
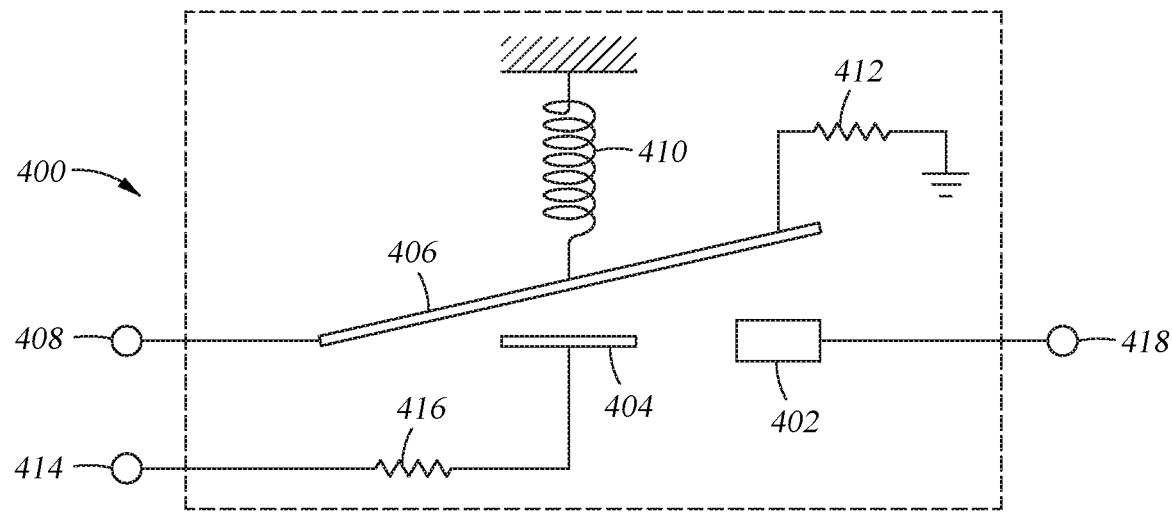
FIG. 4A is a schematic illustration of a MEMS switch having a single contact electrode.

Referring to FIG. 4A, a MEMS switch 400 is illustrated. The MEMS switch 400 is a simplified illustration of a MEMS switch, such as the MEMS ohmic switch 200 shown in FIGS. 2A-2C. The MEMS switch 400 includes at least one contact electrode 402, at least one pull-in electrode 404, and at least one movable beam 406 (also referred to as a MEMS bridge). The at least one movable beam 406 is connected to an electrical node 408 that may carry an RF signal. The at least one movable beam 406 also has a mechanical force, represented by a spring 410, that keeps the at least one movable beam 406 away from the at least one contact electrode 402. It is to be understood that while a spring 410 is illustrated, the spring 410 is simply meant as a visual representation of the mechanical force that is present in the at least one movable beam 406. The at least one movable beam 406 is also DC ground biased by a resistor 412. The at least one pull-in electrode 404 is connected to a control node 414 through a decoupling resistor 416. The at least one contact electrode 402 is connected to a second electrical node 418 that may carry an RF signal. By applying a voltage on the at least one pull-in electrode 404, the ground biased beam 406 undergoes an electrostatic force that pulls the at least one movable beam 406 towards the at least one contact electrode 402 and makes a low-ohmic contact. When the at least one movable beam 406 touches the at least one contact electrode 402, the MEMS switch 400 is considered to be ON; otherwise, the MEMS switch 400 is considered to be OFF.

Figure 4B:
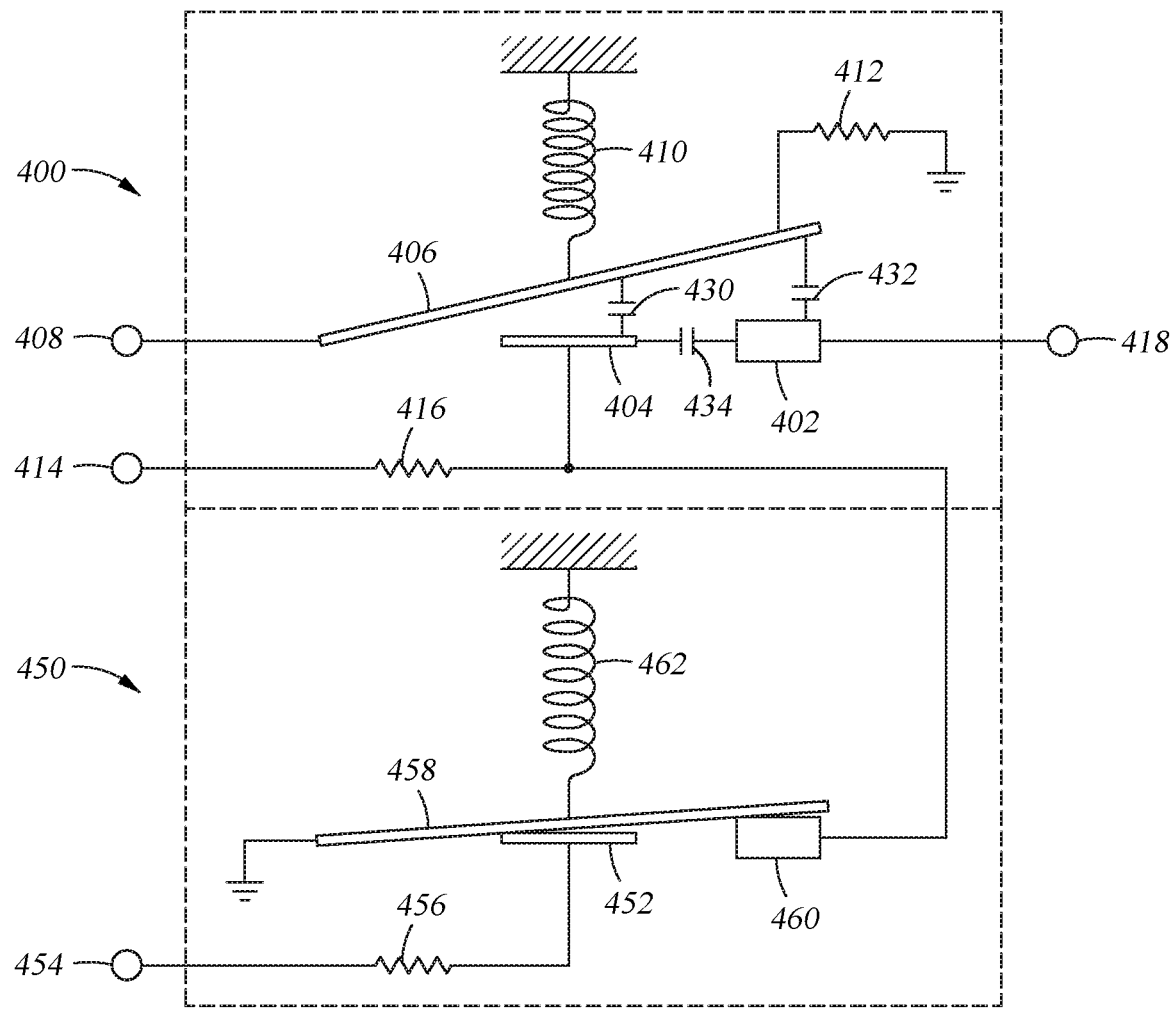
FIG. 4B is a schematic illustration of the MEMS switch having a single contact electrode and a second MEMS switch coupled thereto according to one embodiment.

Due to the fact that the at least one movable beam 406, at least one pull-in electrode 404, and at least one contact electrode 402 are all in proximity of each other, there are unwanted or parasitic capacitances between the elements as shown in FIG. 4B, which together form a capacitance between electrical nodes 408 and 418. The unwanted or parasitic capacitance is referred to as $C_{off}$. A smaller $C_{off}$ results in a better isolation between electrical nodes 408 and 418. Unwanted or parasitic capacitance $C_{bp}$ may also be present at a location 430 between the at least one movable beam 406 and the at least one pull-in electrode 404. Unwanted or parasitic capacitance $C_{bc}$ may also be present at a location 432 between the at least one movable beam 406 and the at least one contact electrode 402. Unwanted or parasitic capacitance $C_{pc}$ may also be present at a location 434 between the at least one pull-in electrode 404 and the at least one contact electrode 402.

The value of $C_{off}$ can be defined by the following equation:

$$C_{off}=C_{bc}+(C_{bp}*C_{pc})/(C_{bp}+C_{pc})$$

This disclosure improves the isolation by reducing $C_{off}$. A second switch 450 is used to connect the at least one pull-in electrode 404 directly to ground and consequently to divert $C_{bp}$ and $C_{pc}$ to ground. Therefore, the second switch removes $C_{bp}$ and $C_{pc}$ from the $C_{off}$ equation, which results in $C_{off}=C_{bc}$. The second switch 450 is referred to as an isolation switch. In one embodiment, the second switch 450 is a MEMS switch; however, it is to be understood that the second switch 450 may be a transistor as the second switch 450 does not require a low $R_{on}$ and low $C_{off}$. Additionally, the second switch 450 may be small relative to the MEMS switch 400 as the second switch 450 only switches a small current running through the unwanted or parasitic capacitances $C_{bp}$ (location 430) and $C_{pc}$ (location 432).

In the non-limiting example of FIG. 4B, a MEMS switch is exemplified as the second switch 450. The second switch 450 includes a pull-in electrode 452 that is connected to an electrical node 454 through a resistor 456. The electrical node 454 has a signal that is opposite the signal of control node 414. The second switch 450 also includes a beam 458 that is directly connected to ground. One or more contact electrodes 460 are also present. The one or more contact electrodes 460 are connected to the at least one pull-in electrode 404 of the MEMS switch 400. As with MEMS switch 400, the second switch 450 is shown to include the beam 458. The beam 458 also has a mechanical force, represented by spring 462, that keeps the beam 458 away from the one or more contact electrodes 460. It is to be understood that while a spring 462 is illustrated, the spring 462 is simply meant as a visual representation of the mechanical force that is present in the beam 458.

Alternatively, it is contemplated that the one or more contact electrodes 460 may be connected to ground while the beam 458 is connected to the at least one pull-in electrode 404 of the MEMS switch 400.

Figure 5A:
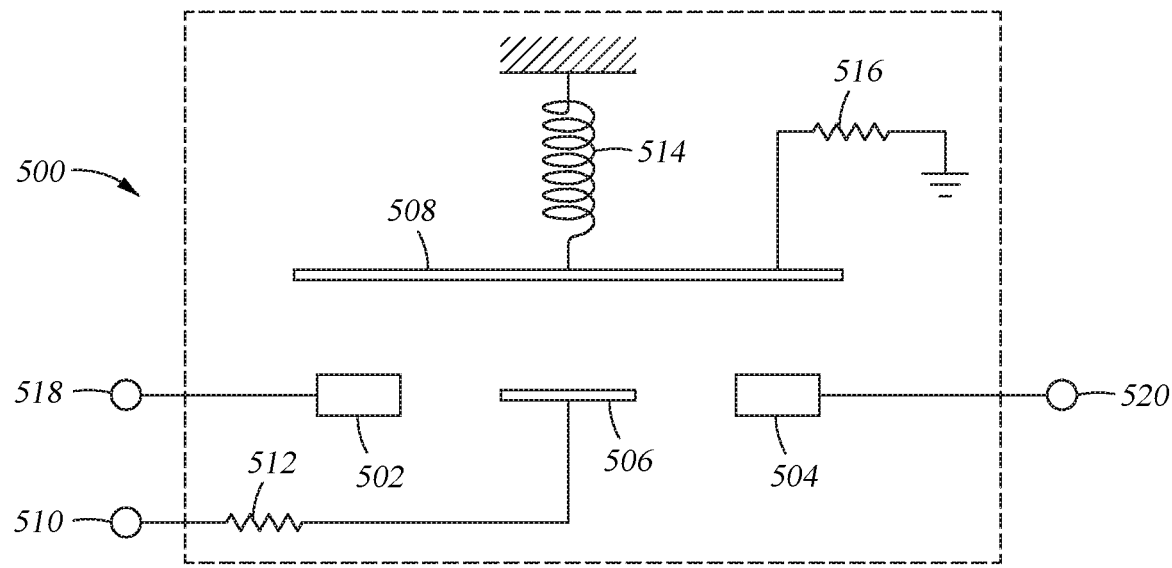
FIG. 5A is a schematic illustration of a MEMS switch having two contact electrodes.

As noted above with regards to FIGS. 3A-3D, oftentimes a MEMS switch has multiple contact electrodes. Multiple contact electrode situations result in additional unwanted or parasitic capacitances. FIG. 5A illustrates a MEMS switch 500 that includes two contact electrodes 502, 504. The MEMS switch 500 also includes at least one pull-in electrode 506, represented by pull-down electrodes 104A-104C in FIGS. 3A-3D, and at least one movable beam 508. The at least one pull-in electrode 506 is coupled to an electrical node 510 through a decoupling resistor 512. The at least one movable beam 508 has a mechanical force, represented by a spring 514, that keeps the at least one movable beam 508 away from the contact electrodes 502, 504. It is to be understood that while a spring 514 is illustrated, the spring 514 is simply meant as a visual representation of the mechanical force that is present in the at least one movable beam 508. The at least one movable beam 508 is DC ground biased through a resistor 516. The at least one movable beam 508 does not carry an RF signal when the MEMS switch 500 is in the OFF state. One contact electrode 502 is coupled to an electrical node 518 that may carry an RF signal. The second contact electrode 504 is coupled to an electrical node 520 that may carry an RF signal. By applying a voltage on the at least one pull-in electrode 506, the ground biased beam 508 undergoes an electrostatic force which pulls the at least one movable beam 508 towards the contact electrodes 502, 504. The at least one movable beam 508 makes a low-ohmic contact between the two contact electrodes 502, 504. When the at least one movable beam 508 touches both contact electrodes 502, 504, the MEMS switch 500 is considered to be ON; otherwise, the MEMS switch 500 is considered to be OFF.

Figure 5B:
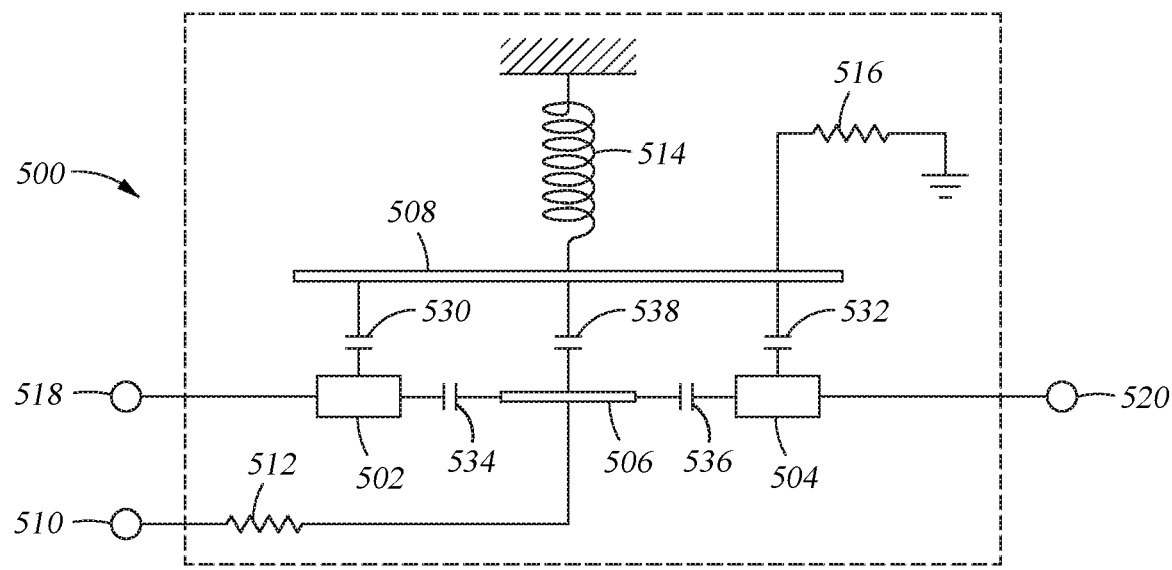
FIG. 5B is a schematic illustration of the MEMS switch of FIG. 5A with several unwanted or parasitic capacitance locations shown.

Due to the fact that the at least one movable beam 508, at least one pull-in electrode 506 and contact electrodes 502, 504 are all in proximity to each other, there are unwanted or parasitic capacitances between the elements, as shown in FIG. 5B, which together form a capacitance between electrical nodes 518, 520, which is called $C_{off}$. There are numerous unwanted or parasitic capacitances present. Unwanted or parasitic capacitance $C_{bc1}$ is present at a location 530 between a first contact electrode 502 and the at least one movable beam 508. Unwanted or parasitic capacitance $C_{bc2}$ is present at a location 532 between a second contact electrode 504 and the at least one movable beam 508. Unwanted or parasitic capacitance $C_{pc1}$ is present at a location 534 between the first contact electrode 502 and the at least one pull-in electrode 506. Unwanted or parasitic capacitance $C_{pc2}$ is present at a location 536 between the second contact electrode 504 and the at least one pull-in electrode 506. Unwanted or parasitic capacitance $C_{bp}$ is present at a location 538 between the at least one pull-in electrode 506 and the at least one movable beam 508. A smaller $C_{off}$ results in better isolation between electrical nodes 518, 520.

Unwanted parasitic capacitance $C_{off}$ can be described in a complicated formula with the above five unwanted or parasitic capacitances. For simplicity, it will only be described here for a symmetric design. In a symmetric design, the unwanted or parasitic capacitance at location 530 is equal to the unwanted or parasitic capacitance at location 532. Additionally, in a symmetric design, the unwanted or parasitic capacitance at location 534 is equal to the unwanted or parasitic capacitance at location 536. In a symmetric design, the unwanted or parasitic capacitance at location 538 has no impact.

For a symmetric system, the value of $C_{off}$ can be defined by the following equation:

$$C_{off}=C_{bc2}/2+C_{pc2}/2$$

The instant disclosure improves the isolation by reducing $C_{off}$. A second switch 550, as will be discussed below, is used to connect both the at least one pull-in electrode 506 and the at least one movable beam 508 directly to ground and to divert $C_{bp}$, $C_{bc1}$, $C_{bc2}$, $C_{pc1}$, and $C_{pc2}$ to ground and remove these from the $C_{off}$ equation, which results in $C_{off}$=0. Electrical nodes 518, 520 are now shielded from each other inside the switch and isolation is determined by unwanted or parasitic capacitance between electrical nodes 518, 820 outside the MEMS switch 500.

The second switch 550, which is an isolation switch, can be a MEMS switch but is not limited to a MEMS switch. Rather, the second switch 550 may be a transistor as the second switch 550 does not require a low $R_{on}$ and low $C_{off}$. The second switch 550 can also be made small relative to MEMS switch 500 as the second switch 550 only switches a small current running through the unwanted or parasitic capacitances.

Figure 5C:
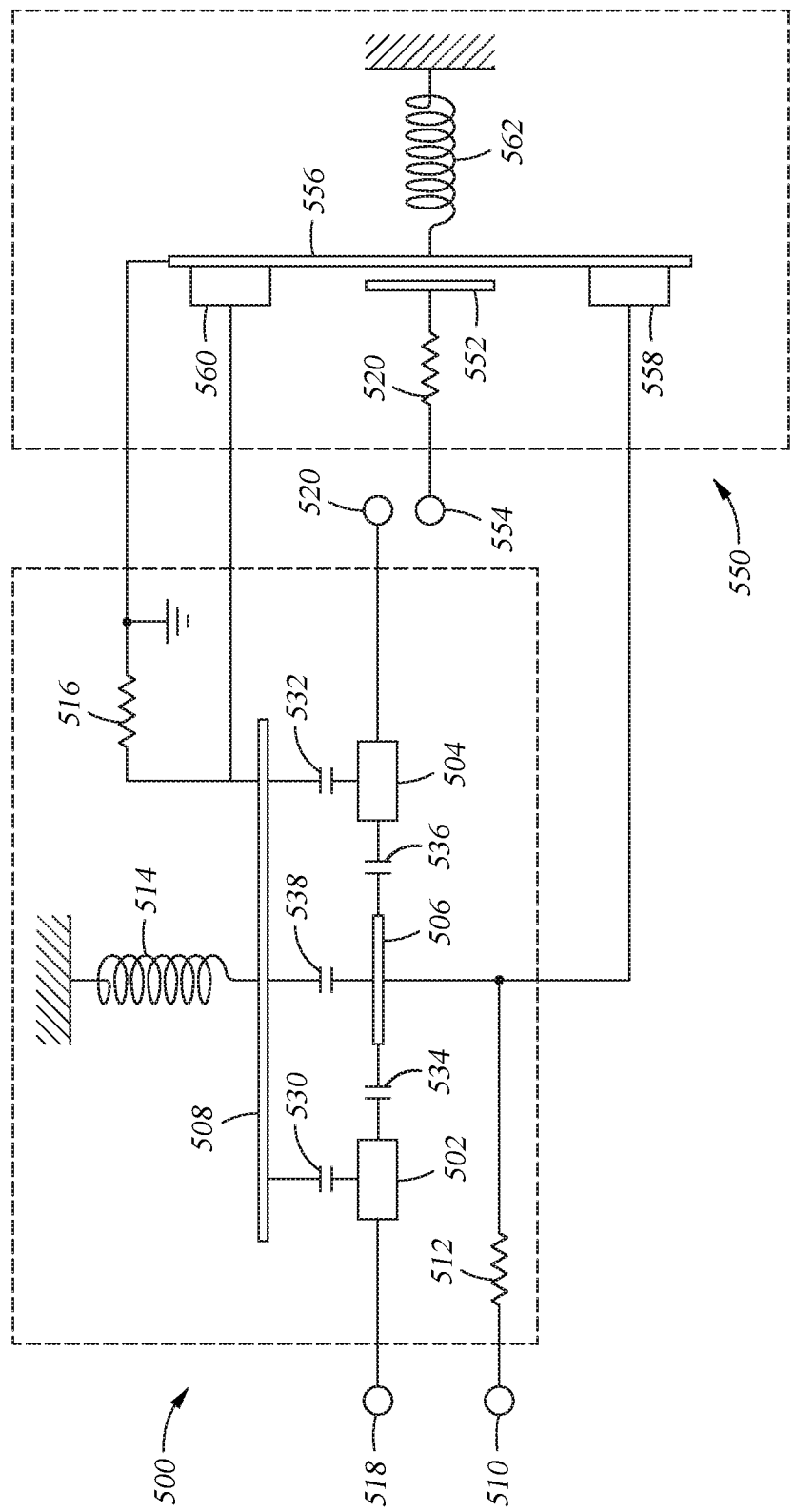
FIG. 5C is a schematic illustration of the MEMS switch having two contact electrodes and a second MEMS switch coupled thereto according to one embodiment.

FIG. 5C includes a non-limiting example of the second switch 550. The second switch 550 is exemplified as a MEMS switch, but it is to be understood that other options are contemplated, such as the transistor mentioned above. The second switch 550 includes a pull-in electrode 552 that is connected to an electrical node 554, that, in operation, has a signal opposite to the at least one pull-in electrode 506 of the MEMS switch 500. The second switch 550 also includes a beam 556 that is directly connected to ground. A first contact electrode 558 is connected to the at least one pull-in electrode 506 of the MEMS switch 500. A second contact electrode 560 is connected to the at least one movable beam 508 of the MEMS switch 500. The second switch 550 results in all unwanted or parasitic capacitances inside the MEMS switch 500 being diverted to ground. Additionally, the resulting $C_{off}$ is virtually zero. The at least one movable beam 508 of MEMS switch 500 does not carry the RF signal in the OFF state and therefore can be grounded during the OFF state without any consequences. It is contemplated that the contact electrode 558 could be connected to ground while the beam 556 is connected to the at least one pull-in electrode 506 of MEMS switch 500. It is also contemplated that the contact electrode 560 could be connected to ground while the beam 556 is connected to the at least one movable beam 508 of MEMS switch 500. The beam 556 has a mechanical force, represented by a spring 562, that keeps the beam 556 away from the contact electrodes 558, 560. It is to be understood that while a spring 562 is illustrated, the spring 562 is simply meant as a visual representation of the mechanical force that is present in the beam 556.

Figure 5D:
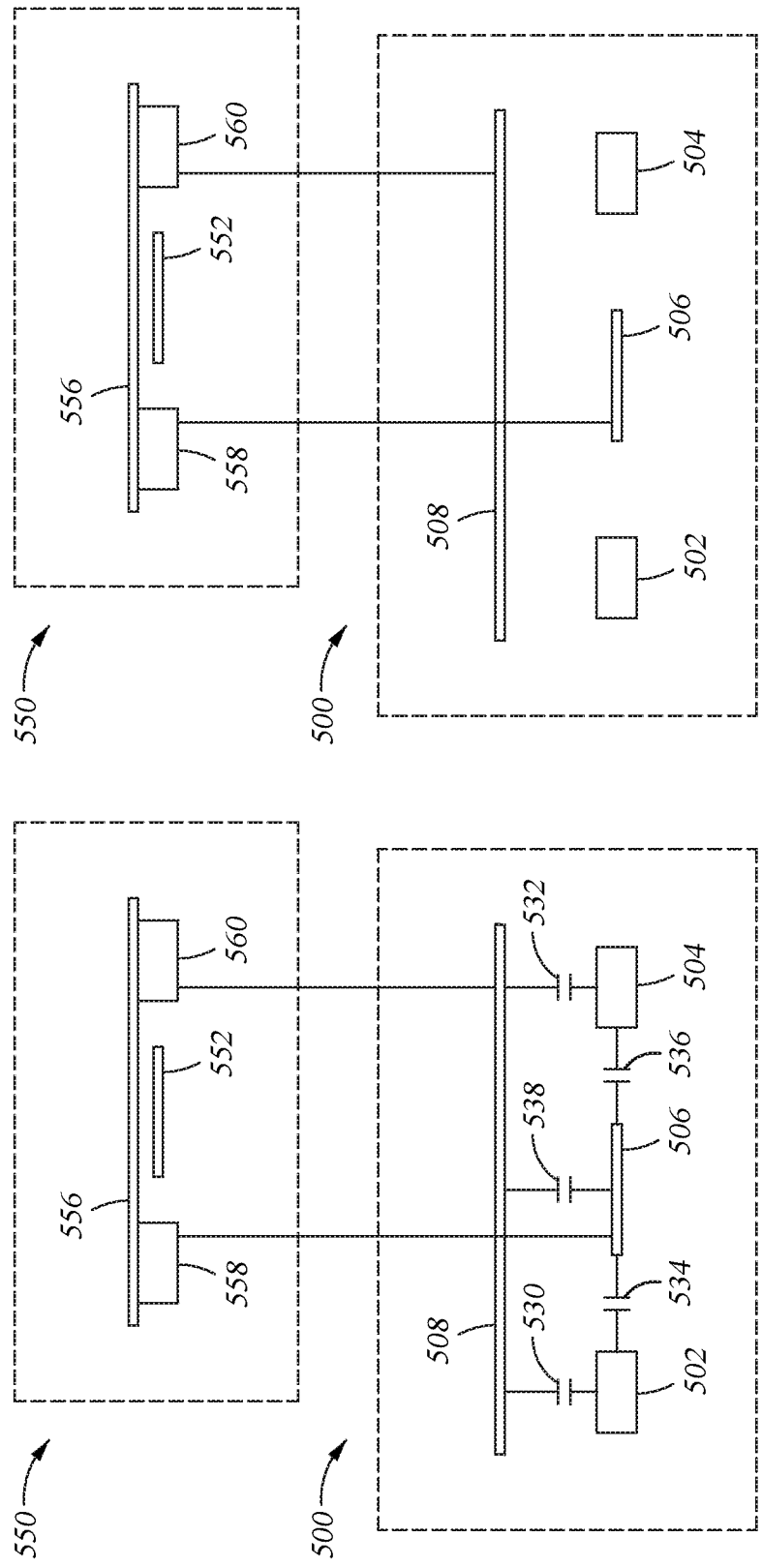
FIG. 5D is a simplified schematic representing the same as FIG. 5C, but with resistors and nodes removed.

FIG. 5D is a simplified schematic representing the same as FIG. 5C, but with resistors and nodes removed for better readability and will be further used in FIGS. 7 and 8.

Figure 6:
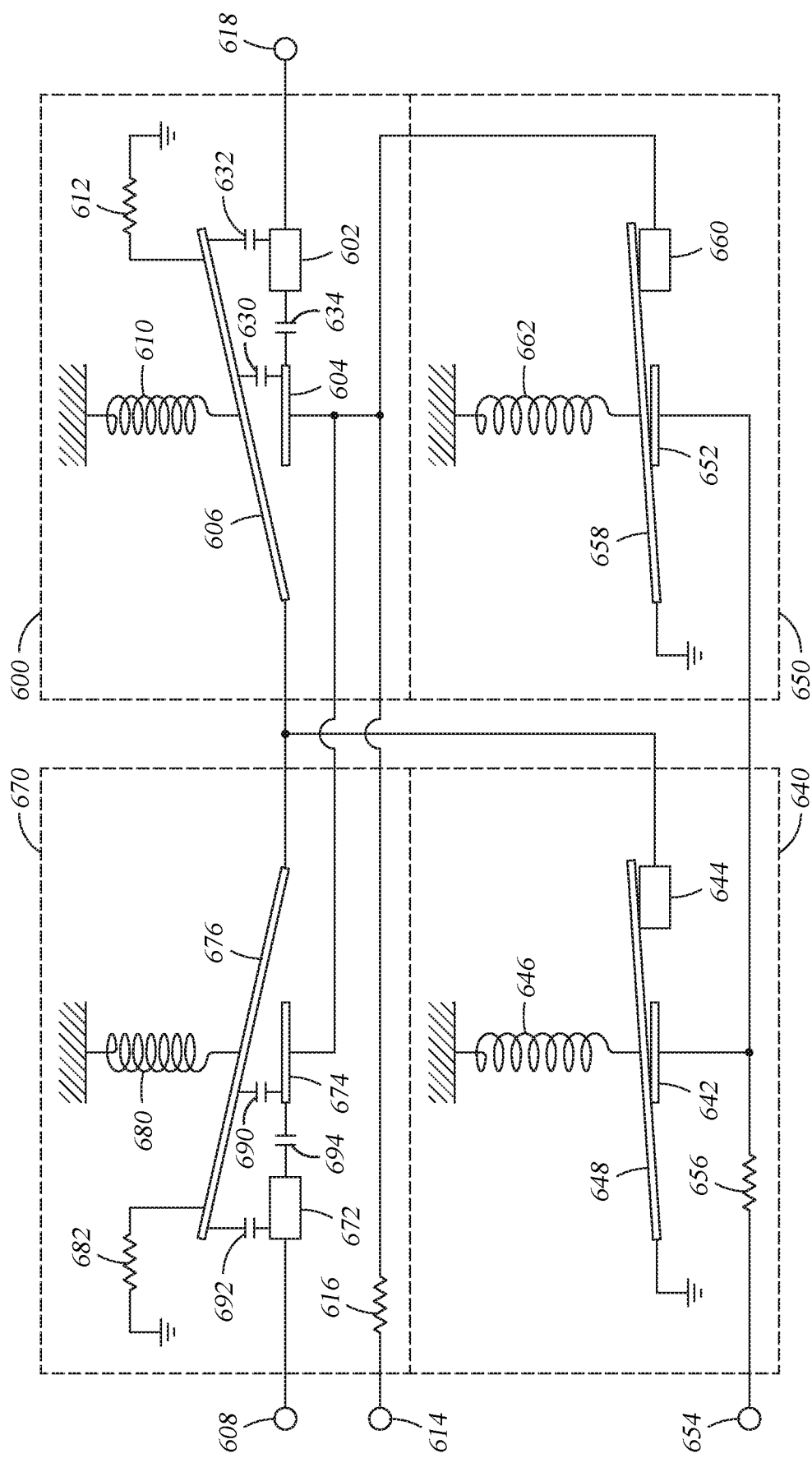
FIG. 6 illustrated a high isolation switch with $C_{off}=0$, based on MEMS switches with one contact electrode.

FIG. 6 describes a high isolation switch with $C_{off}$=0, based on MEMS switches with one contact electrode. To achieve this, the movable beam cannot be coupled to a RF node anymore. Therefore, a second main MEMS switch 670 is added to the original FIG. 4B and its beam 676 is coupled to a beam 606 of a first main switch 600. The second main MEMS switch 670 has a contact electrode 672 coupled to a first RF node 608 and a pull-in electrode 674 coupled to a pull-in electrode 604 of the first main switch 600. The movable beam may be ground-biased by its own resistor 682 or by a ground-biasing resistor 612 of the first main switch 600. The pull-in electrode 674 can also have a resistor to decouple from a control signal node 614 or can share a resistor 616 with the pull-in electrode 604 of the first main switch 600. Now, in case both main switches 600, 670 are OPEN, both beams 606, 676 are not coupled to an RF node anymore and thus can be switched to ground by another isolation switch 640, which together with the already available isolation switch 650, diverts all the unwanted or parasitic capacitances of both switches to ground.

Both main switches 600, 670 need to be capable to withstand the full power and current of the application and therefore should be relatively large and preferably of the same size. The two isolation switches 640, 650 can be MEMS switches but are not limited to MEMS switches. Rather, these switches 640, 650 may be transistors as these switches 640, 650 do not require a low $R_{on}$ and low $C_{off}$. These switches 640, 650 can also be made small relative to main switches 600 and 670 as the isolation switches 640, 650 only switch a small current running through the unwanted or parasitic capacitances.

The two isolation switches 640 and 650 have both their beams 648, 658, respectively, connected to ground, and therefore it is also possible to combine these switches into one switch with two or more contact electrodes. FIG. 2 and FIG. 1B show how such switches may consist of one beam with two or more contacts. The two isolation switches 640, 650 also have pull-in electrodes 642, 652, respectively, that are coupled to a node 654 through a resistor 656. The isolation switches 640, 650 divert the unwanted or parasitic capacitances 630, 632, 634, 690, 692, 694 to ground. Each beam 606, 676, 658, 648 has a mechanical force, represented by springs 610, 680, 662, 646, respectively, that keep the beams 606, 676, 658, 648 away from contact electrodes 602, 672, 660, 644, respectively. It is to be understood that while springs 610, 680, 662, 646 are illustrated, the springs 610, 680, 662, 646 are simply meant as a visual representation of the mechanical force that is present in the beams 606, 676, 658, 648, respectively. Contact electrode 602 is coupled to node 618.

FIG. 6 has the same functionality as FIG. 5C and therefore can also be represented by the simplified FIG. 5D. Hence, the further use of FIG. 5D implies either the use of FIG. 6 or FIG. 5C FIG. 7A describes prior art of a standard Double Pole Double Throw (DPDT) switch 700 consisting of four main switches 712, 722, 732, 742, which are pair-wise controlled. Switches 732 and 742 are always controlled by the same signal and thus are always both CLOSED or both OPEN. Also switches 712 and 722 are always controlled by a signal opposite to the control signal of switches 732 and 742 and thus switches 712 and 722 are always both OPEN or both CLOSED. The control signals are not shown in FIG. 7A. The contact electrodes of Switch 712 are coupled to node 710 and node 730. The contact electrodes of Switch 722 are coupled to node 720 and node 740. The contact electrodes of Switch 732 are coupled to node 730 and node 720. The contact electrodes of Switch 742 are coupled to node 740 and node 710. The DPDT (700) always has two conducting paths: either between node 710 and node 740 and between node 720 and node 730 (as shown in FIG. 7A) or between node 710 and node 730 and between node 720 and 740 (not shown in FIG. 7A).

Figure 7A:
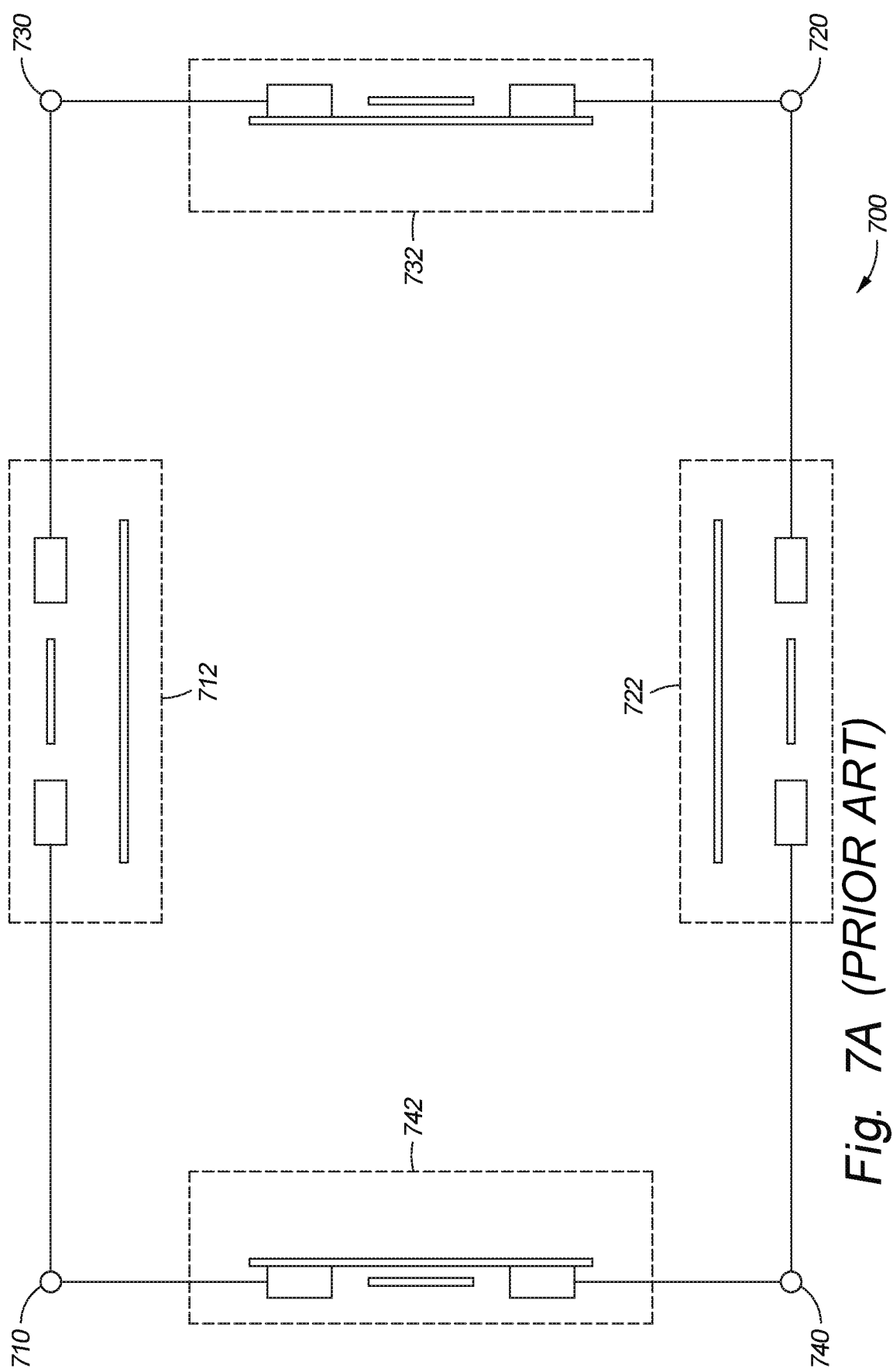
FIG. 7A illustrates a standard Double Pole Double Throw (DPDT) switch consisting of four main switches which are pair-wise controlled.
Figure 7B:
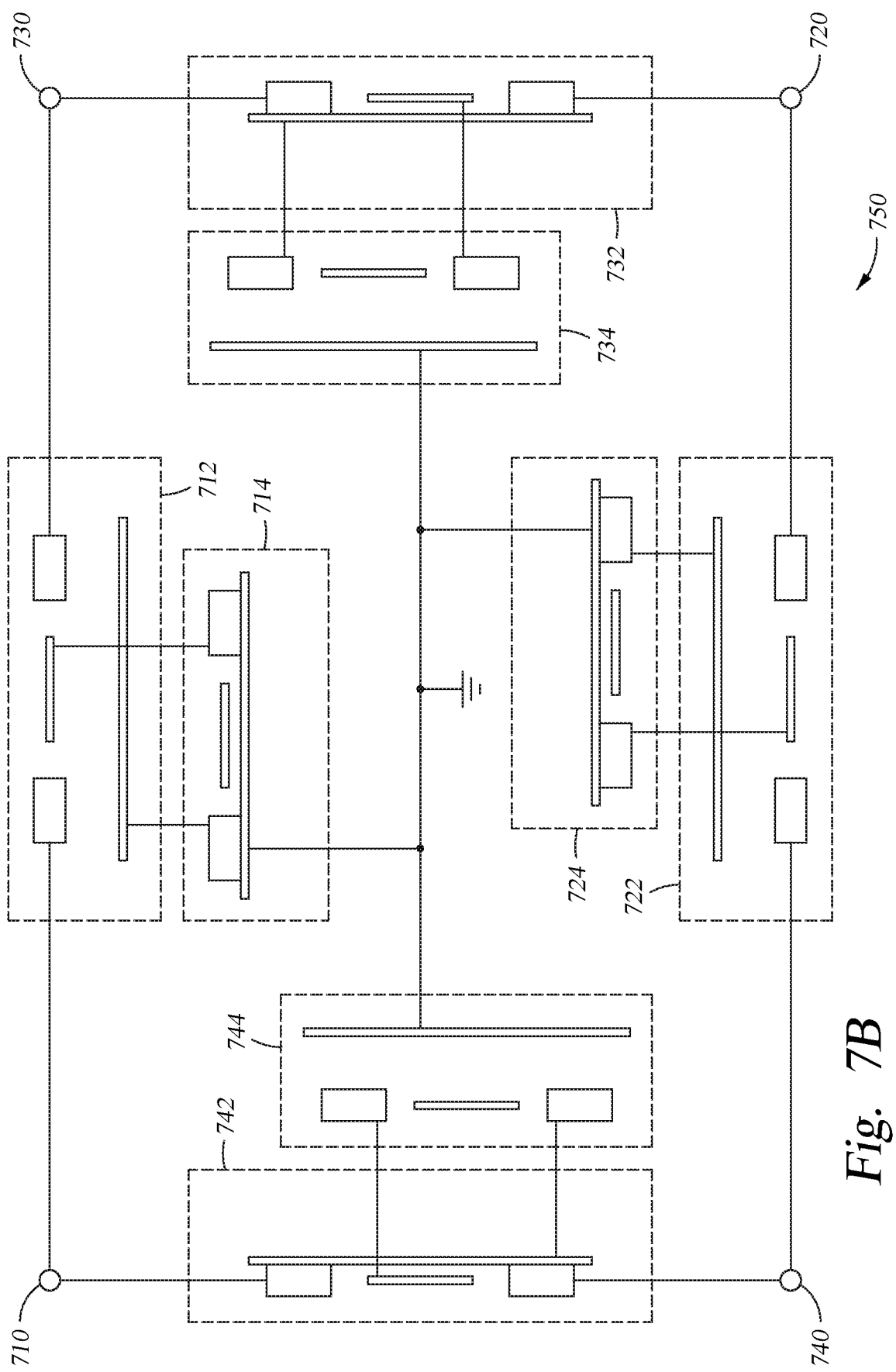
FIG. 7B illustrates a Double Pole Double Throw (DPDT) implementation which adds four isolation switches to the implementation of FIG. 7A.

FIG. 7B describes a Double Pole Double Throw (DPDT) implementation 750, which adds four isolation switches 714, 724, 734, 744 to the implementation of FIG. 7A to improve the isolation for the non-conducting paths. The beam of each isolation switch 714, 724, 734, 744 is connected to ground. The two contact electrodes of isolation switch 714 couple to the beam and pull-in electrode of main switch 712. The two contact electrodes of isolation switch 724 couple to the beam and pull-in electrode of main switch 722. The two contact electrodes of isolation switch 734 couple to the beam and pull-in electrode of main switch 732. The two contact electrodes of isolation switch 744 couple to the beam and pull-in electrode of main switch 742. The control signal coupled to the pull-in electrode of the isolation switch 714 is oppositely controlled versus the control signal coupled to the pull-in electrode of the main switch 712. The control signal coupled to the pull-in electrode of the isolation switch 724 is oppositely controlled versus the control signal coupled to the pull-in electrode of the main switch 722. The control signal coupled to the pull-in electrode of the isolation switch 734 is oppositely controlled versus the control signal coupled to the pull-in electrode of the main switch 732. The control signal coupled to the pull-in electrode of the isolation switch 744 is oppositely controlled versus the control signal coupled to the pull-in electrode of the main switch 742.

The DPDT 750 always has two conducting paths: either between node 710 and node 740 and between node 720 and node 730, while improving isolation between node 710 and node 730 and improving isolation between node 720 and node 740 (as shown in FIG. 7B) or between node 710 and node 730 and between node 720 and 740, while improving isolation between node 710 and node 730 and improving isolation between node 720 and node 740 (not shown in FIG. 7B).

Figure 8A:
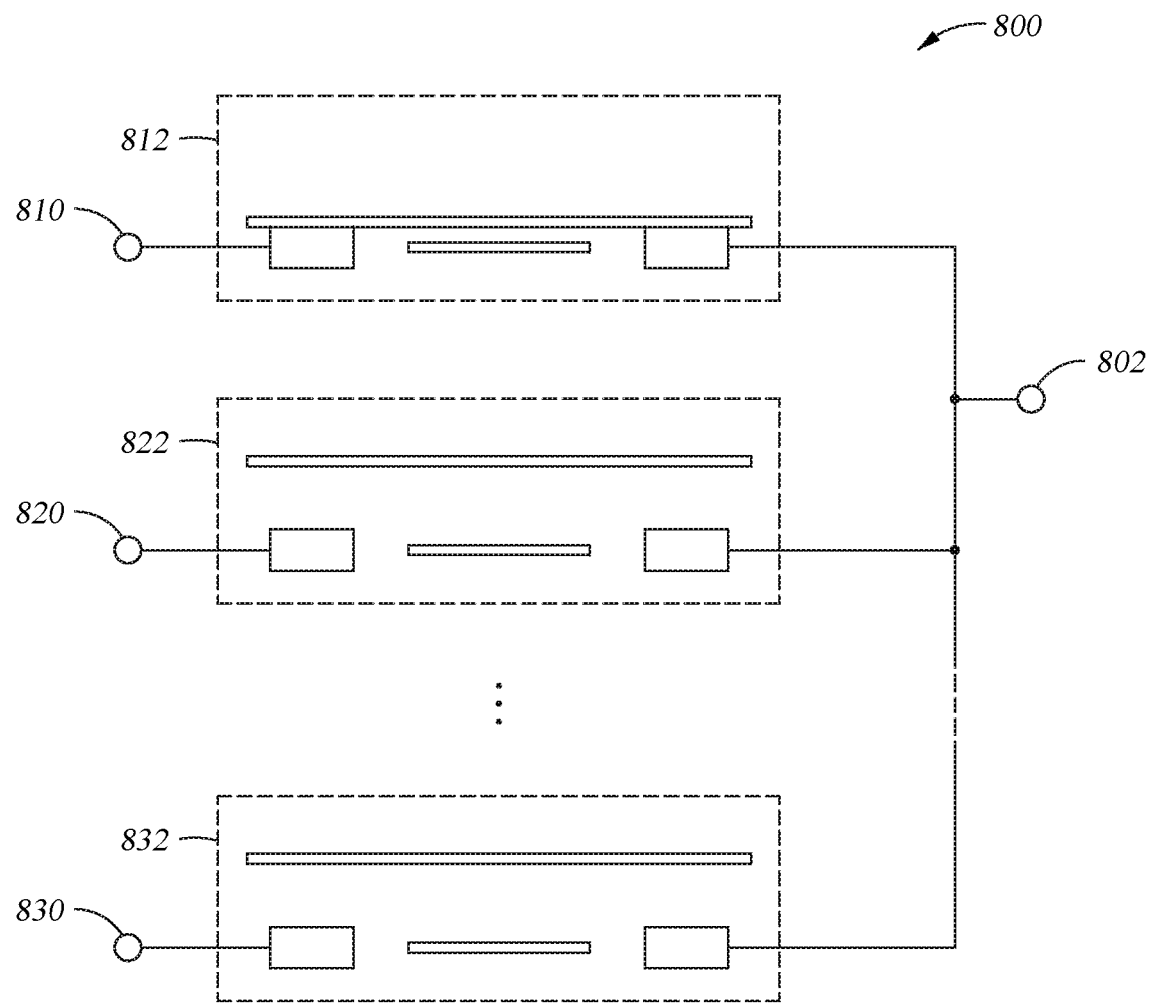
FIGS. 8A-8C illustrate Single Pole Multi Throw switches.

FIG. 8A describes a standard Single Pole Multi Throw switch 800 (SPxT, with x being any integer). It creates a conducting path between one of the multiple throws (here nodes 810, 820, 830) and the main pole (node 802). The multiple switches 812, 822, 832 couple one of their contact electrodes to the main pole (node 802) and their other contact electrode to their corresponding throws (nodes 810, 820 or 830). The pull-in electrode of each switch is coupled to a mutually exclusive control signal, and these switches can be controlled independently from each other. When a switch is OFF, the isolation between the nodes coupled to its contact electrodes is determined by the combination of the unwanted or parasitic capacitances together called $C_{off}$. This $C_{off}$ determines the isolation between node 820 and 802 in FIG. 8A.

Figure 8B:
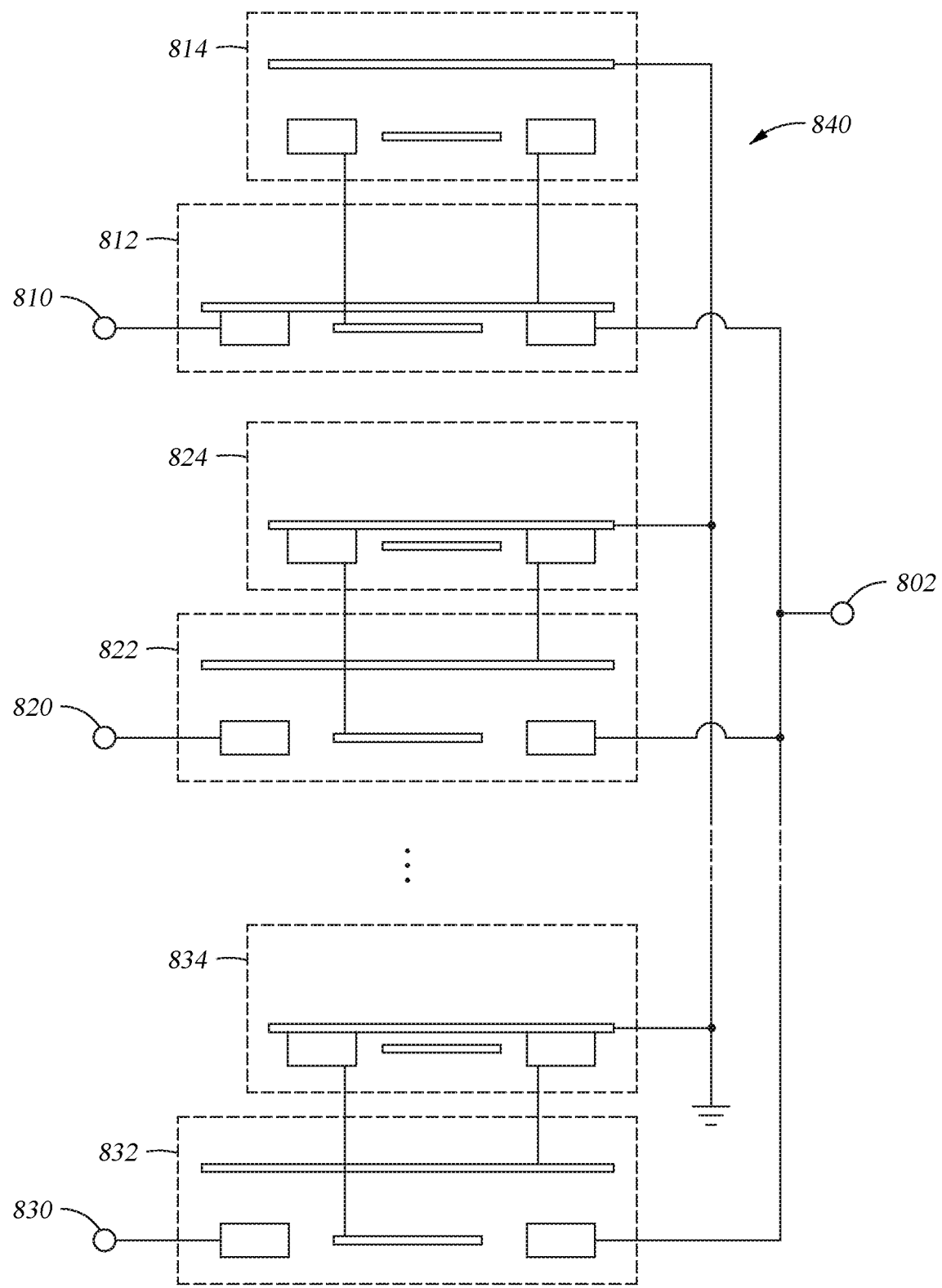

FIG. 8B describes a Single Pole Multi Throw switch 840 (SPxT, with x being any integer) and adds an isolation switch (814, 824, 834) to each main switch (812, 822, 832), respectively, of the Single Pole Multi Throw switch 800. The beam of each isolation switch (814, 824, 834) is connected to ground. The two contact electrodes of any successive isolation switch (814, 824, 834), respectively, couple to the beam and pull-in electrode of the corresponding main switch (812, 822, 832), respectively. The control signal coupled to the pull-in electrode of any successive isolation switch (814, 824, 834), respectively, is oppositely controlled versus the control signal coupled to the pull-in electrode of its corresponding main switch (812, 822, 832), respectively.

When a main switch is OFF, its unwanted or parasitic capacitances are diverted to ground by its coupled isolation switch, and this virtually eliminates any capacitance between its contact electrodes. The presence of the isolation switch 822 significantly improves the isolation between node 820 and node 802, for example, and may be limited by the isolation outside the switch.

Two more standard SPxT configurations may improve isolation. These have an oppositely controlled grounding switch from each throw towards ground through a resistor. In case the resistors are zero, the switch is of type reflective shorted. In the case the resistors match the system impedance (e.g. 50 Ohm), these configurations are called absorptive switches. Note that in case a full power signal exists on the throw, these grounding switches need to withstand the full power, and therefore these grounding switches may be larger switches than the isolation switches of previous configurations. The extra load of this larger grounding switch in OPEN state also has a negative impact on the insertion loss of the main switch in CLOSED state.

Figure 8C:
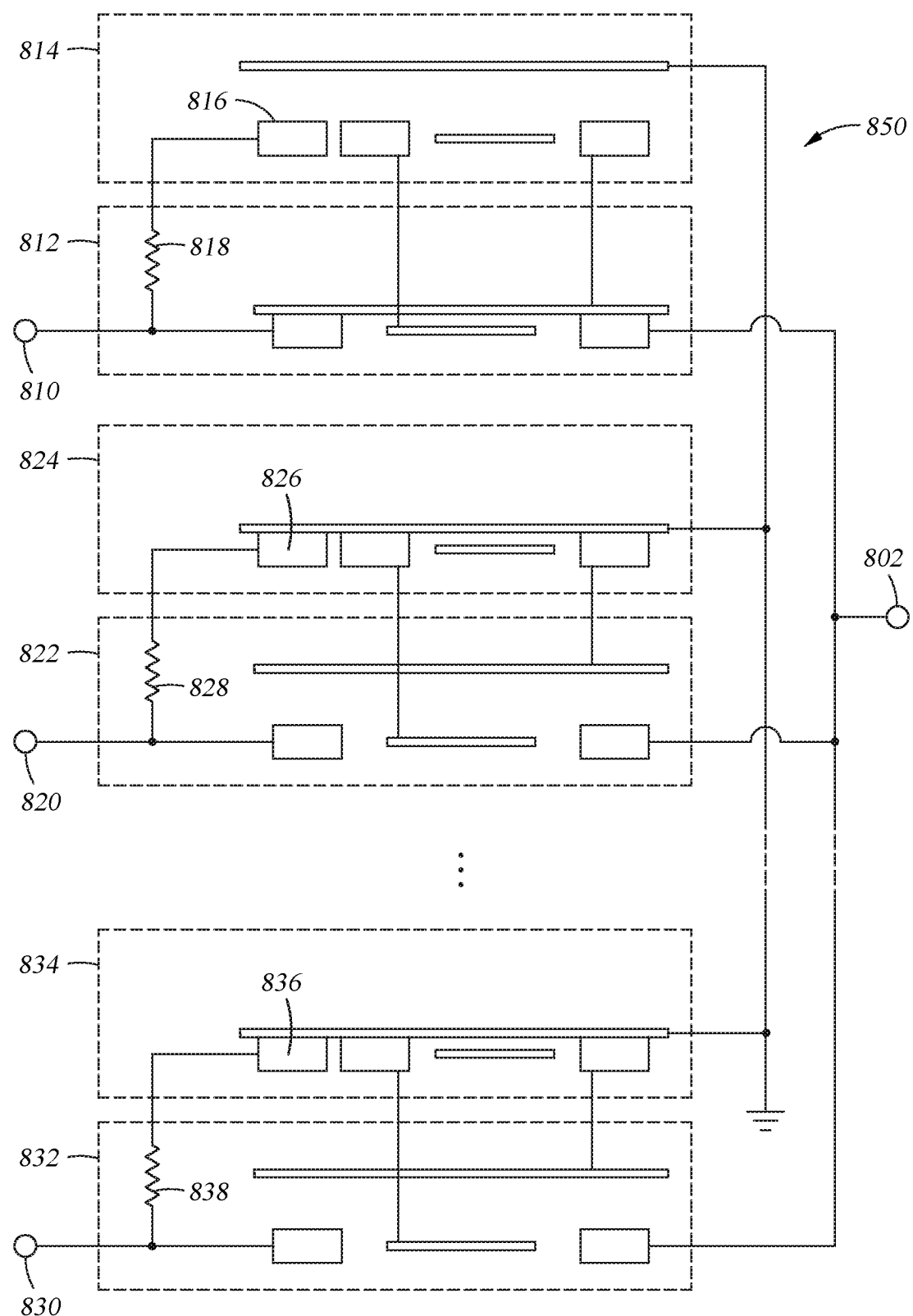

Such grounding switches may also be added to the Single Pole Multi Throw switch 840. FIG. 8C describes a Single Pole Multi Throw switch 850 (SPxT, with x being any integer) and adds an extra contact electrode (816, 826, 836) to each isolation switch (814, 824, 834) of the ingle Pole Multi Throw switch 840. Contact electrode 816 is coupled to node 810 through a resistor 818. Contact electrode 826 is coupled to node 820 through a resistor 828. Contact electrode 836 is coupled to node 830 through a resistor 838. The resistors 818, 828, 838 can have any value but typically are either zero or are matched to the system impedance (e.g. 50 Ohm).

Note that in case a full power signal exists on a throw, the extra contact electrodes 816, 826, 836 may need to withstand the full power and therefore the extra contact electrodes 816, 826, 836 may make the isolation switch significantly larger than the isolation switches of previous configurations. The extra load of this larger isolation switch in OPEN state also has a negative impact on the insertion loss of the main switch in CLOSED state.

The Single Pole Multi Throw switch 840 provides a very similar isolation than the Single Pole Multi Throw switch 850, while its insertion loss is significantly better. Therefore, generally the Single Pole Multi Throw switch 840 will prevail over the Single Pole Multi Throw switch 850.

In one embodiment, a MEMS device comprises: a first MEMS switch and a second MEMS switch. The first MEMS switch comprises at least one contact electrode; at least one pull-in electrode, and a movable beam. The second MEMS switch comprises: at least one contact electrode, wherein the at least one contact electrode is coupled to the at least one pull-in electrode; at least one pull-in electrode; and a movable beam. The movable beam is coupled to an electric node. The electric node is an RF node. The movable beam is coupled to ground. The at least one pull-in electrode is coupled to an electrical node. A resistor is coupled between the at least one pull-in electrode and the electrical node. The at least one contact electrode is coupled to an RF node. The pull-in electrode is coupled to an electrical node. The at least one contact electrode includes a first contact electrode and a second contact electrode. The at least one pull-in electrode is disposed between the first contact electrode and the second contact electrode. The movable beam is coupled to a resistor. In another embodiment, a method of operating the MEMS device comprises: applying a voltage to the at least one pull-in electrode. The movable beam is grounded.

Those skilled in the art will recognize improvements and modifications to the embodiments of the present disclosure. All such improvements and modifications are considered within the scope of the concepts disclosed herein and the claims that follow.

What is claimed is:

1. An apparatus comprising:
a main microelectromechanical systems (MEMS) switch comprising:
 a substrate;
 a pull-down electrode disposed over the substrate;
 a contact electrode disposed over the substrate and spaced from the pull-down electrode;
 an anchor electrode attached to the substrate and spaced from both the pull-down electrode and the contact electrode; and
 a beam having a movable portion suspended over the pull-down electrode and a contact portion suspended over the contact electrode with an end of the beam fixed to the anchor electrode, wherein an activation voltage applied to the pull-down electrode generates an electrostatic force that pulls the movable portion such that the contact portion of the beam comes into contact with the contact electrode; and
an isolation switch having a first isolation electrode coupled to the pull-down electrode, a second isolation electrode coupled to ground, and an isolation control electrode, wherein parasitic capacitance between the beam and the pull-down electrode is reduced when a control voltage applied to the isolation control electrode causes the first isolation electrode to be electrically coupled to ground.

2. The apparatus of claim 1 wherein the isolation switch is a transistor comprising the first isolation electrode, the second isolation electrode, and the isolation control electrode, wherein the first isolation electrode is coupled to the pull-down electrode and the second isolation electrode is coupled to ground.

3. The apparatus of claim 1 wherein the isolation switch is a MEMS switch comprising:
 a second pull-down electrode disposed over the substrate, wherein the second pull-down electrode is the isolation control electrode;
 a second contact electrode disposed over the substrate and spaced from the second pull-down electrode, wherein the second contact electrode is the first isolation electrode;
 a second anchor electrode fixed to the substrate and spaced from both the second pull-down electrode and the second contact electrode, wherein the second anchor electrode is the second isolation electrode; and
 a second beam having a second movable portion suspended over the second pull-down electrode and a second contact portion suspended over the second contact electrode with a second end of the second beam fixed to the second anchor electrode, wherein a second activation voltage applied to the second pull-down electrode generates a second electrostatic force that pulls the second movable portion such that the second contact portion of the second beam comes into contact with the second contact electrode.

4. The apparatus of claim 3 further including a third contact electrode disposed over the substrate and spaced from the second pull-down electrode, wherein the third contact electrode is coupled to the beam of the main MEMS switch and is configured such that the second activation voltage applied to the second pull-down electrode generates the second electrostatic force that pulls the second movable portion, thereby bringing a contact portion of the second beam into contact with the third contact electrode.

5. The apparatus of claim 1 wherein the beam is coupled to ground through a resistor.

6. The apparatus of claim 1 wherein the contact electrode is configured to pass a radio frequency signal.

7. The apparatus of claim 1 further including a dielectric layer disposed over the pull-down electrode.

8. The apparatus of claim 7 wherein the dielectric layer comprises silicon based material.

9. The apparatus of claim 7 wherein the dielectric layer has a thickness between 50 nanometers and 150 nanometers.

10. An apparatus comprising:
a plurality of main MEMS switches that each comprise:
a substrate;
a pull-down electrode disposed over the substrate;
a contact electrode disposed over the substrate and spaced from the pull-down electrode;
an anchor electrode attached to the substrate and spaced from both the pull-down electrode and the contact electrode; and
a beam having a movable portion suspended over the pull-down electrode and a contact portion suspended over the contact electrode with an end of the beam fixed to the anchor electrode, wherein an activation voltage applied to the pull-down electrode generates an electrostatic force that pulls the movable portion such that the contact portion of the beam comes into contact with the contact electrode; and
an isolation switch having a first isolation electrode coupled to the pull-down electrode, a second isolation electrode coupled to ground, and an isolation control electrode, wherein parasitic capacitance between the beam and the pull-down electrode is reduced when a control voltage applied to the isolation control electrode causes the first isolation electrode to be electrically coupled to ground.

11. The apparatus of claim 10 wherein the isolation switch of each of the plurality of main MEMS switches is a transistor comprising the first isolation electrode, the second isolation electrode, and the isolation control electrode, wherein the first isolation electrode is coupled to the pull-down electrode and the second isolation electrode is coupled to ground.

12. The apparatus of claim 10 wherein the isolation switch of each of the plurality of main MEMS switches is a second MEMS switch comprising:

a second pull-down electrode disposed over the substrate, wherein the second pull-down electrode is the isolation control electrode;
a second contact electrode disposed over the substrate and spaced from the second pull-down electrode, wherein the second contact electrode is the first isolation electrode;
a second anchor electrode fixed to the substrate and spaced from both the second pull-down electrode and the second contact electrode, wherein the second anchor electrode is the second isolation electrode; and
a second beam having a second movable portion suspended over the second pull-down electrode and a second contact portion suspended over the second contact electrode with a second end of the second beam fixed to the second anchor electrode, wherein a second activation voltage applied to the second pull-down electrode generates a second electrostatic force that pulls the second movable portion such that the second contact portion of the second beam comes into contact with the second contact electrode.

13. The apparatus of claim 12 wherein each isolation switch of the plurality of main MEMS switches further includes a third contact electrode disposed over the substrate and spaced from the second pull-down electrode, wherein the third contact electrode is coupled to the beam of the plurality of main MEMS switches and is configured such that the second activation voltage applied to the second pull-down electrode generates the second electrostatic force that pulls the second movable portion thereby bringing a contact portion of the second beam into contact with the third contact electrode.

14. The apparatus of claim 10 wherein the beam of each of the plurality of main MEMS switches is coupled to ground through a resistor.

15. The apparatus of claim 10 wherein the contact electrode is configured to pass a radio frequency signal.

16. The apparatus of claim 10 wherein the plurality of main MEMS switches are coupled in a single-pole multi-throw switch configuration.

17. The apparatus of claim 10 wherein the plurality of main MEMS switches are coupled in a double-pole double-throw configuration.

18. The apparatus of claim 10 further including a dielectric layer disposed over the pull-down electrode.

19. The apparatus of claim 18 wherein the dielectric layer comprises silicon based material.

20. The apparatus of claim 18 wherein the dielectric layer has a thickness between 50 nanometers and 150 nanometers.

* * * * *